(12) United States Patent
Zang et al.

(10) Patent No.: US 11,480,832 B2
(45) Date of Patent: Oct. 25, 2022

(54) ARRAY SUBSTRATE AND DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Pengcheng Zang, Beijing (CN); Yuanjie Xu, Beijing (CN); Bo Shi, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/287,486

(22) PCT Filed: Jan. 21, 2020

(86) PCT No.: PCT/CN2020/073481
§ 371 (c)(1),
(2) Date: Apr. 21, 2021

(87) PCT Pub. No.: WO2021/146907
PCT Pub. Date: Jul. 29, 2021

(65) Prior Publication Data
US 2022/0050340 A1 Feb. 17, 2022

(51) Int. Cl.
*G02F 1/1343* (2006.01)
*G02F 1/1362* (2006.01)
(Continued)

(52) U.S. Cl.
CPC .. *G02F 1/134336* (2013.01); *G02F 1/134318* (2021.01); *G02F 1/134345* (2021.01);
(Continued)

(58) Field of Classification Search
None
See application file for complete search history.

(56) References Cited

U.S. PATENT DOCUMENTS

2009/0086149 A1* 4/2009 Kim ................. G02F 1/134363
349/144
2009/0096978 A1* 4/2009 Kim ................. G02F 1/134309
349/144

(Continued)

FOREIGN PATENT DOCUMENTS

CN 1379277 A * 11/2002 ....... G02F 1/136227
CN 102629055 A 8/2012
(Continued)

*Primary Examiner* — Shan Liu
(74) *Attorney, Agent, or Firm* — IP & T Group LLP

(57) ABSTRACT

An array substrate is provided, including a first base substrate, gate lines, common electrodes, and pixel electrodes. The gate lines are disposed on the first base substrate and extend in a first direction. The common electrodes and the pixel electrodes are disposed at a side of the gate lines away from the first base substrate. The pixel electrodes are arranged in an array and into rows of pixel electrodes extending in the first direction. At least one pixel electrode in each row of pixel electrodes includes two pixel sub-electrodes arranged in a second direction intersecting the first direction, at least one gate line is disposed between the two pixel sub-electrodes, and the two pixel sub-electrodes are coupled to a gate line in the at least one gate line. Each electrode in at least electrodes, farther away from the first base substrate, in the common electrodes and the pixel electrodes has slits.

16 Claims, 24 Drawing Sheets

(51) Int. Cl.
*G02F 1/1368* (2006.01)
*G02F 1/1335* (2006.01)

(52) U.S. Cl.
CPC .. *G02F 1/134363* (2013.01); *G02F 1/136286* (2013.01); *G02F 1/13685* (2021.01); *G02F 1/133512* (2013.01); *G02F 1/133514* (2013.01); *G02F 1/136209* (2013.01); *G02F 1/136222* (2021.01)

(56) References Cited

U.S. PATENT DOCUMENTS

| | | | | |
|---|---|---|---|---|
| 2009/0251654 | A1* | 10/2009 | Itou | G02F 1/134363 349/141 |
| 2011/0216280 | A1* | 9/2011 | Itou | G02F 1/133707 349/143 |
| 2013/0105831 | A1 | 5/2013 | Li et al. | |
| 2013/0120680 | A1* | 5/2013 | Sun | G02F 1/133707 349/43 |
| 2013/0147698 | A1* | 6/2013 | Kang | G09G 3/3648 345/88 |
| 2013/0188109 | A1* | 7/2013 | Chen | G02F 1/134309 349/46 |
| 2014/0009711 | A1* | 1/2014 | Tomioka | G02F 1/134363 349/43 |
| 2016/0026048 | A1* | 1/2016 | Liu | G02F 1/1362 257/72 |
| 2016/0154282 | A1* | 6/2016 | Kim | G02F 1/134309 349/138 |
| 2016/0259460 | A1* | 9/2016 | Yang | G06F 3/0445 |
| 2017/0108745 | A1* | 4/2017 | Jia | G02F 1/136286 |
| 2017/0176817 | A1* | 6/2017 | Tseng | G02F 1/13394 |

FOREIGN PATENT DOCUMENTS

| | | |
|---|---|---|
| CN | 102830549 A | 12/2012 |
| CN | 202886793 U | 4/2013 |
| CN | 103412675 A | 11/2013 |
| CN | 104122713 A | 10/2014 |
| JP | 2008-242374 A | 10/2008 |

\* cited by examiner

ARRAY SUBSTRATE AND DISPLAY PANEL

CROSS-REFERENCE TO RELATED APPLICATIONS

This application is a national phase entry under 35 USC 371 of International Patent Application No. PCT/CN2020/073481, filed on Jan. 21, 2020, which is incorporated herein by reference in its entirety.

TECHNICAL FIELD

The present disclosure relates to the field of display technologies, and in particular, to an array substrate and a display panel.

BACKGROUND

Liquid crystal display panels are widely used in electronic display devices, such as mobile phones, TVs, notebook computers, etc., due to their characteristics of low radiation and small thickness.

SUMMARY

In an aspect, an array substrate is provided. The array substrate includes: a first base substrate, a plurality of gate lines, a plurality of common electrodes, and a plurality of pixel electrodes. The plurality of gate lines are disposed on the first base substrate and extend in a first direction. The plurality of common electrodes are disposed at a side of the plurality of gate lines away from the first base substrate. The plurality of pixel electrodes are disposed at the side of the plurality of gate lines away from the first base substrate, and are arranged in an array. The plurality of pixel electrodes are arranged into a plurality of rows of pixel electrodes extending in the first direction, at least one pixel electrode in each row of pixel electrodes includes two pixel sub-electrodes arranged in a second direction, at least one gate line is disposed between the two pixel sub-electrodes, and the two pixel sub-electrodes are coupled to a gate line in the at least one gate line. Each electrode in at least electrodes, farther away from the first base substrate, in the plurality of common electrodes and the plurality of pixel electrodes has a plurality of slits. The first direction and the second direction intersect.

In some embodiments, the array substrate further includes a plurality of connection electrodes. The plurality of connection electrodes are arranged in the first direction. Two pixel sub-electrodes of at least one pixel electrode in each row of pixel electrodes are electrically connected to each other through a connection electrode of the plurality of connection electrodes, and the connection electrode is coupled to a gate line located between the two pixel sub-electrodes.

In some embodiments, the connection electrode in the plurality of connection electrodes includes a first connection portion and the two second connection portions coupled to two ends of the first connection portion, respectively. The first connection portion extends from one of two pixel sub-electrodes electrically connected by the connection electrode to another. The two second connection portions are coupled to the two pixel sub-electrodes electrically connected to the connection electrode, respectively.

In some embodiments, the first connection portion extends in the second direction. At least one second connection portion in the two second connection portions extends in the first direction.

In some embodiments, the array substrate further includes a source-drain electrode layer disposed at a side of the plurality of pixel electrodes proximate to the first base substrate. The source-drain electrode layer includes sources and drains of a plurality of thin film transistors. The plurality of connection electrodes are located in the source-drain electrode layer and are made of a same material as the sources and the drains. Each pixel electrode is coupled to a drain of a thin film transistor in the plurality of thin film transistors through a connection electrode of the plurality of connection electrodes.

In some embodiment, the plurality of connection electrodes and the plurality of pixel electrodes are located in a same layer and are made of a same material.

In some embodiment, the array substrate has a plurality of sub-pixel regions, and the plurality of common electrodes and the plurality of pixel electrodes are disposed in the plurality of sub-pixel regions. Each sub-pixel region of the plurality of sub-pixel regions includes two sub-regions, and two pixel sub-electrodes of each pixel electrode are disposed in two sub-regions of a sub-pixel region, respectively. Each common electrode includes two common sub-electrodes, and the two common sub-electrodes are disposed in two sub-regions of a sub-pixel region, respectively. At least one, farther away from the first base substrate, in a pixel sub-electrode and a common sub-electrode located in a same sub-region has slits, and extending directions of the slits are same.

In some embodiments, in each sub-region, an extending direction of an edge of a pixel sub-electrode away from a gate line to which the pixel sub-electrode is coupled is consistent with slit extending directions of sub-electrodes located in the sub-region and each having slits.

In some embodiments, in a same sub-pixel region, slit extending directions of sub-electrodes located in two sub-regions and each having slits are different.

In some embodiments, in the same sub-pixel region, the slit extending directions of the sub-electrodes located in the two sub-regions and each having slits are a third direction and a fourth direction. An included angle between the third direction and the first direction, and an included angle between the fourth direction and the first direction are both greater than or equal to 0° and less than 90°. The third direction and the fourth direction are symmetrical about the first direction.

In some embodiments, in two sub-regions that are adjacent in the second direction and belong to two adjacent sub-pixel regions, slit extending directions of sub-electrodes each having slits are same.

In some embodiments, one gate line is disposed between two pixel sub-electrodes of each pixel electrode in each row of pixel electrodes.

In some embodiments, two gate lines are disposed between the two pixel sub-electrodes of each pixel electrode in each row of pixel electrodes, and the two gate lines are a first gate line and a second gate line. Each row of pixel electrodes includes first pixel electrodes and second pixel electrodes that are alternately arranged, two pixel sub-electrodes included in a first pixel electrode are coupled to a first gate line, and two pixel sub-electrodes included in a second pixel electrode are coupled to a second gate line.

In some embodiments, the array substrate further includes a color filter layer, and the color filter layer includes a plurality of color filter portions arranged in an array. Along the second direction, each column of color filter portions allows light with a same color to pass through. An orthographic projection of each color filter portion of the plurality of color filter portions on the first base substrate overlaps with or substantially overlaps with orthographic projections of two pixel sub-electrodes that are adjacent in the second direction and belong to different pixel electrodes on the first base substrate.

In some embodiments, the array substrate further includes a black matrix. The black matrix includes first black matrix strips extending in the first direction and second black matrix strips extending in the second direction, and the first black matrix strips and the second black matrix strips are disposed in gaps between the plurality of color filter portions. In a case where the array substrate includes a plurality of connection electrodes, each connection electrode includes a first connection portion and two second connection portions, and the plurality of connection electrodes are made of a light-shielding material, a width of the first black matrix strip is less than a width of a gap between two pixel sub-electrodes that are adjacent in the second direction and belong to a same pixel electrode, and is greater than or equal to a width of a gap between two adjacent second connection portions in the second direction.

In some embodiments, a width of a gap between two pixel sub-electrodes that are in the second direction and adjacent, and belong to different pixel electrodes is in a range from 2.5 µm to 3.5 µm.

In another aspect, a display panel is provided. The display panel includes: the array substrate according to any one of the above embodiments, a counter substrate disposed opposite to the array substrate, and a liquid crystal layer disposed between the array substrate and the counter substrate.

In some embodiments, in a case where the array substrate does not include the color filter layer, the counter substrate includes a second base substrate, and a color filter layer disposed on a side of the second base substrate proximate to the array substrate. The color filter layer includes a plurality of color filter portions arranged in an array. Along the second direction, each column of color filter portions has a same color. An orthographic projection of each color filter portion of the plurality of color filter portions on the first base substrate of the array substrate overlaps with orthographic projections of two pixel sub-electrodes that are adjacent in the second direction and belong to different pixel electrodes on the first base substrate.

In some embodiments, the array substrate further includes a black matrix. The black matrix includes first black matrix strips extending in the first direction and second black matrix strips extending in the second direction, and the first black matrix strips and the second black matrix strips are disposed in gaps between the plurality of color filter portions. In a case where the array substrate includes a plurality of connection electrodes, each connection electrode includes a first connection portion and two second connection portions, and the plurality of connection electrodes are made of a light-shielding material, a width of the first black matrix strip is less than a width of a gap between two pixel sub-electrodes that are adjacent in the second direction and belong to a same pixel electrode, and is greater than or equal to a width of a gap between two adjacent second connection portions in the second direction.

BRIEF DESCRIPTION OF THE DRAWINGS

In order to describe technical solutions in the present disclosure more clearly, accompanying drawings to be used in the description of some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual dimensions of products, actual processes of methods and actual timings of signals involved in the embodiments of the present disclosure.

DETAILED DESCRIPTION

Figure 1:
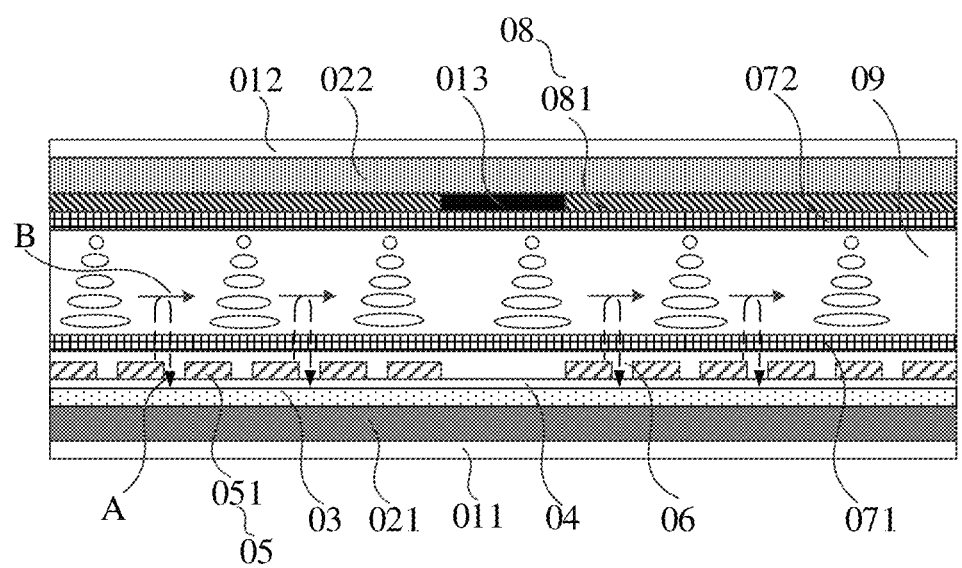
FIG. 1 is a sectional view of a partial structure of a liquid crystal display panel in the related art.

Technical solutions in some embodiments of the present disclosure will be described clearly and completely below with reference to accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, the term "comprise" and other forms thereof such as the third-person singular form "comprises" and the present participle form "comprising" throughout the description and claims are construed as an open and inclusive meaning, i.e., "including, but not limited to". In the description of the specification, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Terms such as "first" and "second" are used for descriptive purposes only, and are not to be construed as indicating or implying the relative importance or implicitly indicating the number of indicated technical features below. Thus, features defined with "first" and "second" may explicitly or implicitly include one or more of the features. In the description of the embodiments of the present disclosure, terms "a plurality of", "the plurality of" and "multiple" mean two or more unless otherwise specified.

In the description of some embodiments, the expressions such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electric contact. However, the term "coupled" or "communicatively coupled" may also mean that two or more components are not in direct contact with each other, but still cooperate or interact with each other. The embodiments disclosed herein are not necessarily limited to the contents herein.

For a liquid crystal display panel, the higher the transmittance of the liquid crystal display panel, the higher the light extraction efficiency thereof, and the lower the energy consumption thereof. The transmittance of the liquid crystal display panel is generally related to an aperture ratio of a sub-pixel, a transmittance of a color filter layer in a color filter substrate, a luminous efficiency of a liquid crystal layer, and transmittances of polarizers.

The aperture ratio of the sub-pixel refers to a ratio of an area of a region through which light can pass in each sub-pixel to an area of an entire region of the sub-pixel. The higher the aperture ratio of the sub-pixel, the higher the transmittance of light passing through the sub-pixel.

The luminous efficiency of the liquid crystal layer refers to a light extraction efficiency of the liquid crystal layer. The light extraction efficiency of the liquid crystal layer is related to a relative light extraction area of the liquid crystal layer and an intensity of an electric field where liquid crystal molecules in the liquid crystal layer are located. The relative light extraction area of the liquid crystal layer refers to an area of a region through which light can pass of the liquid crystal layer. The larger the relative light extraction area of the liquid crystal layer, the higher the light extraction efficiency of the liquid crystal layer. Moreover, the stronger the intensity of the electric field where the liquid crystal molecules in the liquid crystal layer are located, the higher the light extraction efficiency of the liquid crystal layer.

Materials, of which the color filter layer and the polarizers are made, are generally fixed, which makes the transmittance of the color filter layer and the transmittances of the polarizers relatively fixed. Therefore, it is generally the light extraction efficiency of the liquid crystal layer that has a great influence on the transmittance of the liquid crystal display panel.

In the liquid crystal display panel, such as a liquid crystal display panel designed by adopting advanced super dimension switch (ADS), a horizontal electric field formed between a pixel electrode and a common electrode is mainly used to drive liquid crystal molecules to rotate.

For example, FIG. 1 shows a structure of an ADS type liquid crystal display panel, in a normally white mode, along a direction perpendicular to a display surface of the display panel. The ADS-type liquid crystal display panel includes a first polarizer 011, a first base substrate 021, a common electrode layer 03, a first insulating layer 04, a pixel electrode layer 05, a second insulating layer 06, a first alignment layer 071, a liquid crystal layer 09, a second alignment layer 072, a color filter layer 08, a second base substrate 022, and a second polarizer 012. The pixel electrode layer 05 includes a plurality of pixel electrodes 051. The color filter layer 08 includes a plurality of color filter portions 081. The liquid crystal display panel further includes a black matrix 013, which is used for avoiding cross-color between adjacent color filter portions 081. Alignment directions of the first alignment layer 071 and the second alignment layer 072 are perpendicular to or substantially perpendicular to each other. Polarization directions of the first polarizer 011 and the second polarizer 012 are perpendicular to or substantially perpendicular to each other.

Based on the above structure of the liquid crystal display panel, in a case where no electric field is applied to the liquid crystal layer 09 (for example, no voltage is applied to the pixel electrode layer 05 and the common electrode layer 03), since the alignment directions of the first alignment layer 071 and the second alignment layer 072 are perpendicular to or substantially perpendicular to each other, in the liquid crystal molecules in the liquid crystal layer 09, a difference of a deflection angle between an alignment of a liquid crystal molecule proximate to the first alignment layer 071 and an alignment of a liquid crystal molecule proximate to the second alignment layer 072 is approximately 90 degrees.

In this way, light provided by a backlight module disposed on a side of the liquid crystal display panel (for example, a side of the first polarizer 011 away from the first base substrate 021) are incident from the first polarizer 011, and a polarization direction of the light passing through the first polarizer 011 is changed by approximately 90 degrees after passing through the liquid crystal layer 09. Since the polarization directions of the first polarizer 011 and the second polarizer 012 are perpendicular to or substantially perpendicular to each other, all or almost all of the light can exit from the second polarizer 012, so that the liquid crystal display panel displays an image with a maximum brightness, i.e., displays a white image.

In a case where electric fields are applied to the liquid crystal layer 09, that is, when pixel voltages are applied to the pixel electrodes 051, and a common voltage is applied to the common electrode layer 03, electric fields are formed between the pixel electrodes 051 and the common electrode layer 03, and electric field lines of the electric fields are directed from the pixel electrodes 051 to the common electrode layer 03. For example, the directions of part of the electric field lines in the electric fields are as shown by arrows A in FIG. 1, and the directions of at least part of the electric field lines at places where their curvature is large are in tangential directions of the places, as shown by arrows B in FIG. 1. This allows the pixel electrodes 051 and the common electrode layer 03 to form lateral electric fields in the liquid crystal layer 09 as shown by arrows B in FIG. 1, and the liquid crystal molecules in the liquid crystal layer 09 are laterally deflected under the driven of the lateral electric fields.

In this way, after the light passing through the first polarizer 011 passes through the liquid crystal layer 09, the polarization direction of at least portion of the light will not be changed by 90 degrees. As a result, at least portion of the light passing through the first polarizer 011 cannot pass through the second polarizer 012, so that the liquid crystal display panel can display an image with a certain gray scale. By changing magnitude of the pixel voltages applied to the pixel electrodes 051, display of images with different gray scales (i.e., different brightness) may be realized.

In the above liquid crystal display panel, as pixels per inch (PPI, i.e., a number of pixels per inch) of pixels increase, the number of color filter portions 081 in the color filter layer 08 corresponding to the pixel electrodes 051 also increases, which causes an increase in the number of rows and columns of the black matrix 013 configured to separate two adjacent color filter portions 081 in the liquid crystal display panel, thereby resulting in an increase in an area of the black matrix 013. Since the black matrix 013 will block light passed through the liquid crystal layer 09, a relative light extraction area of the liquid crystal layer 09 is reduced, resulting in an obvious reduction in a light extraction efficiency of the liquid crystal layer 09. However, if a manner of enhancing an intensity of the electric field where the liquid crystal molecules in the liquid crystal layer 09 are located by increasing the pixel voltage applied to the pixel electrode is adopted to enhance the light extraction efficiency of the liquid crystal layer 09, energy consumption of the liquid crystal display panel may be excessively large.

Referring to FIGS. 3A to 3C, and 4A to 4E, some embodiments of the present disclosure provide an array substrate 1. The array substrate 1 may be applied to a liquid crystal display panel, such as an ADS type liquid crystal display panel, a fringe field switching (FPS) type liquid crystal display panel, etc. The array substrate 1 includes a first base substrate 11, a plurality of gate lines 12, a plurality of common electrodes 13, and a plurality of pixel electrodes 14.

Here, in some embodiments, the plurality of common electrodes 13 may be connected to each other to form a planar electrode with a whole layer structure, i.e., a common electrode layer. In some other embodiments, the plurality of common electrodes 13 may also be a plurality of electrodes that are independently arranged from each other, and the plurality of common electrodes 13 are configured to transmit a same electrical signal, such as a common voltage signal.

Figure 3A:
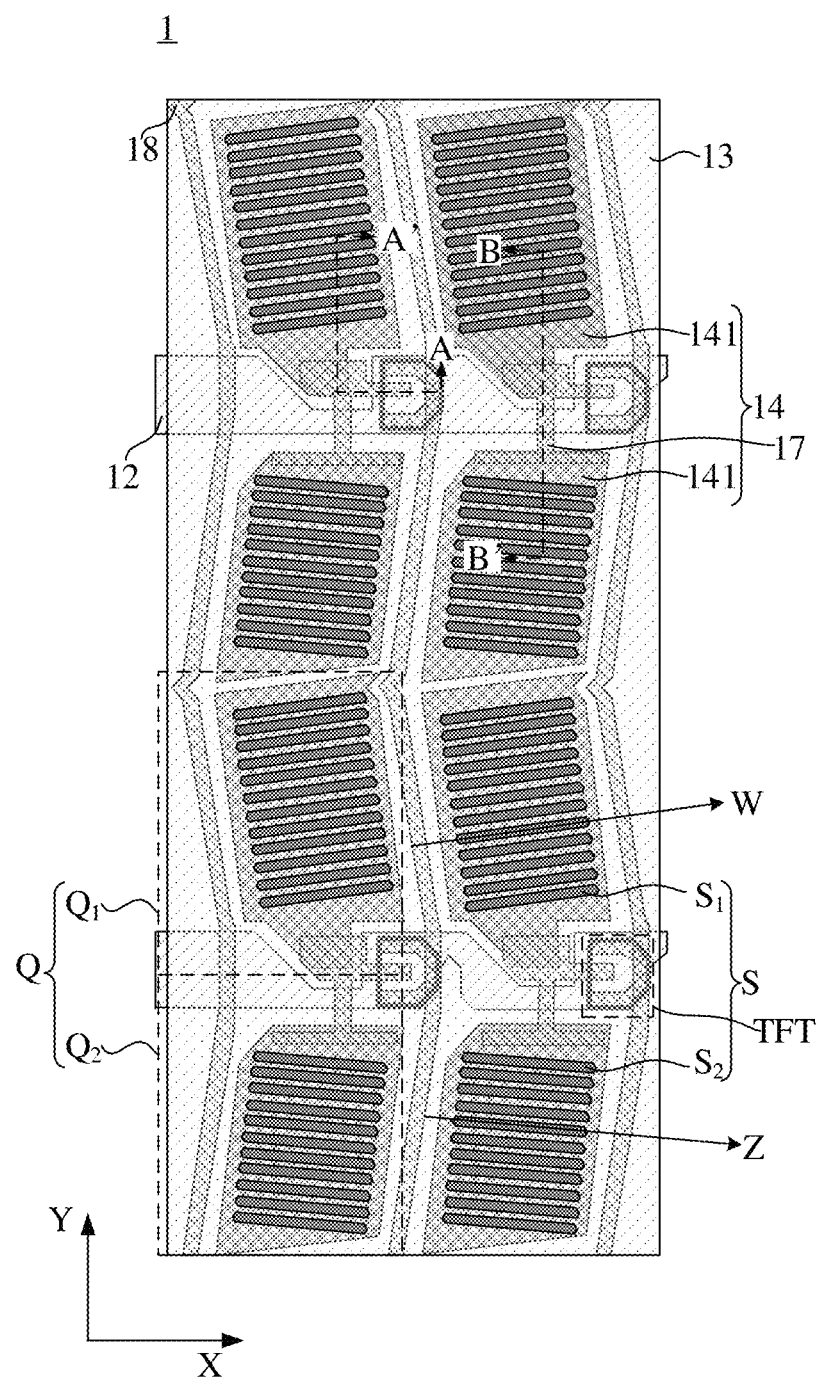
FIG. 3A is a top view of a partial structure of a pixel architecture, in accordance with some embodiments of the present disclosure.
Figure 4A:
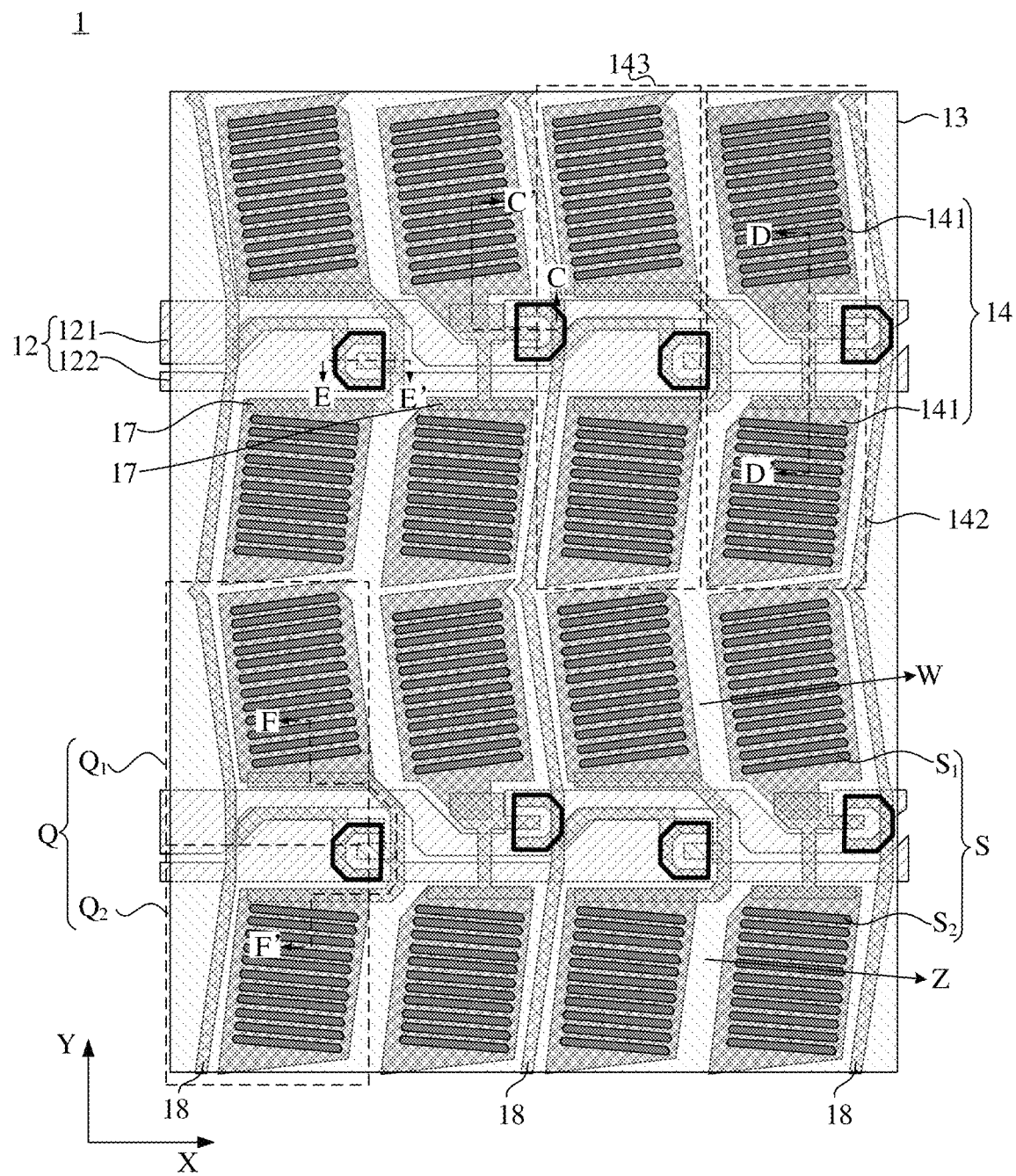
FIG. 4A is a top view of a partial structure of another pixel architecture, in accordance with some embodiments of the present disclosure.

In the array substrate 1, the plurality of gate lines 12 are disposed on the first base substrate 11, and the plurality of gate lines 12 extend in a first direction X. The plurality of common electrodes 13 are disposed at a side of the plurality of gate lines 12 away from the first base substrate 11. The plurality of pixel electrodes 14 are disposed at the side of the plurality of gate lines 12 away from the first base substrate 11, and are arranged in an array (as shown in FIGS. 3A and 4A). For example, it may be that the plurality of pixel electrodes 14 are disposed at a side of the plurality of common electrodes 13 proximate to the first base substrate 11. Or, it may also be that the plurality of pixel electrodes 14 are disposed at a side of the plurality of common electrodes 13 away from the first base substrate 11.

Referring to FIGS. 3A and 4A, the plurality of pixel electrodes 14 are arranged in an array. The first direction X is a row direction when the plurality of pixel electrodes 14 are arranged in an array, whereas a second direction Y mentioned below is a column direction when the plurality of pixel electrodes 14 are arranged in an array. The first direction X and the second direction Y intersect. For example, the two may be perpendicular to each other.

The plurality of pixel electrodes 14 are arranged into a plurality of rows of pixel electrodes 14 extending in the first direction X. As shown in FIGS. 3A and 4A, at least one pixel electrode 14 in each row of pixel electrodes 14 includes two pixel sub-electrodes 141 arranged in the second direction Y, at least one gate line 12 is provided between the two pixel sub-electrodes 141 of the at least one pixel electrode 14 in each row of pixel electrodes 14, and the two pixel sub-electrodes 141 are coupled to a gate line 12 in the at least one gate line 12. That the two pixel sub-electrodes 141 are coupled to a gate line 12 in the at least one gate line 12 described herein means that the two pixel sub-electrodes 141 are coupled to a gate line 12 in the at least one gate line 12 through a thin film transistor TFT corresponding to the two pixel sub-electrodes 141.

In some embodiments, each pixel electrode 14 in each row of pixel electrodes 14 includes two pixel sub-electrodes 141 arranged in the second direction Y. In this case, each row of pixel electrodes 14 corresponds to at least one gate line 12, and the at least one gate line 12 corresponding to the row of pixel electrodes 14 is located between two pixel sub-electrodes 141 of each pixel electrode 14 in the row of pixel electrodes 14. That is, an orthographic projection of at least one gate line 12 corresponding to each row of pixel electrodes 14 on the first base substrate 11 is located between two orthographic projections of two rows of pixel sub-electrodes 141 included in the row of pixel electrodes 14 on the first base substrate 11.

Each electrode in at least electrodes, farther away from the first base substrate 11, in the plurality of common electrodes 13 and the plurality of pixel electrodes 14 has a plurality of slits, which may include at least the following three cases.

In a first case, as shown in FIGS. 3B, 3C, 4B, and 4E, the plurality of common electrodes 13 are disposed at a side of the plurality of pixel electrodes 14 away from the first base substrate 11, and each common electrode 13 of the plurality of common electrodes 13 has a plurality of slits S.

In a second case, the plurality of pixel electrodes 14 are disposed at a side of the plurality of common electrodes 13 away from the first base substrate 11, and each of two pixel sub-electrodes 141 included in each of the plurality of pixel electrodes 14 has multiple slits S.

In the third case, each common electrode 13 has a plurality of slits S, and each of two pixel sub-electrodes 141 of each pixel electrode 14 also has multiple slits S. Moreover, orthographic projections of slits S of each of two pixel sub-electrodes 141 in each pixel electrode 14 on the first base substrate 11 are interlaced with orthographic projections of slits of a common electrode 13 in the plurality of common electrodes 13 on the first base substrate 11.

In this way, in either case, each pixel sub-electrode 141 may form a lateral electric field with a common electrode 13 through its own slits or the slits S of the common electrode 13, so as to drive liquid crystal molecules in a region where the lateral electric field is located to deflect through the electric field.

On this basis, in a case where the array substrate 1 is applied to a liquid crystal display panel of which a driving mode is line inversion or dot inversion, polarities of pixel voltages applied to two pixel sub-electrodes 141 corresponding to different rows of pixel electrodes 14, located between two adjacent rows of gate lines 12, and in a same column are opposite. In this way, since the polarities of the pixel voltages applied to the two pixel sub-electrodes 141 between the two adjacent rows of gate lines 12 and in the same column are opposite, in addition to a lateral electric field formed between each of the two adjacent pixel sub-electrodes 141 and the common electrode 13, a lateral superimposed electric field is also formed between the two adjacent pixel sub-electrodes 141. As a result, an intensity of electric fields at a position adjacent to the two adjacent pixel sub-electrodes 141 is enhanced, which is beneficial to drive the liquid crystal molecules in the region to deflect, so as to enhance the light extraction efficiency of the liquid crystal layer in the region, thereby increasing the transmittance of the liquid crystal display panel.

In addition, since the array substrate 1 can improve the transmittance of the liquid crystal display panel, in a case where the liquid crystal display panel displays an image with a same brightness as the liquid crystal display panel in the related art, the pixel voltage applied to the pixel electrode 14 of the liquid crystal display panel may be smaller, thereby reducing power consumption of the liquid crystal display panel.

The line inversion means that, in a driving period of one frame, polarities of pixel voltages provided to any two adjacent rows of pixel electrodes 14 are opposite, and in a driving period of any two adjacent frames, polarities of pixel voltages provided to a same row of pixel electrodes 14 are opposite.

The dot inversion means that, in a driving period of a same frame, polarities of pixel voltages provided to any two adjacent pixel electrodes 14 (including two adjacent pixel electrodes in the row direction and two adjacent pixel electrodes in the column direction) are opposite, and in a driving period of any two adjacent frames, polarities of pixel voltages provided to a same pixel electrode 14 are opposite.

In some embodiments of the present disclosure, that at least one gate line 12 is provided between two pixel sub-electrodes 141 of each pixel electrode 14 in each row of pixel electrodes 14 at least includes two cases: one gate line 12 is provided between the two pixel sub-electrodes 141 of each pixel electrode 14 in each row of pixel electrodes 14, and two gate lines 12 are provided between the two pixel sub-electrodes 141 of each pixel electrode 14 in each row of pixel electrodes 14. That is, each row of pixel electrodes 14 corresponds to one gate line 12, or each row of pixel electrodes 14 corresponds to two gate lines 12.

Figure 3B:
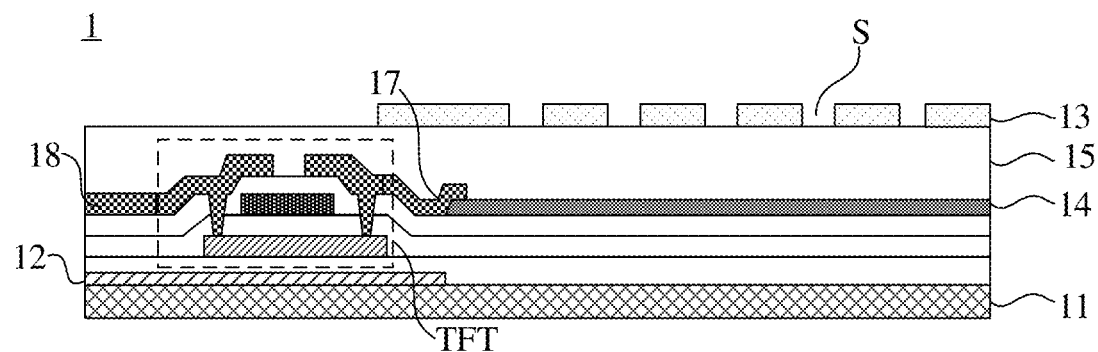
FIG. 3B is a sectional view of the partial structure in FIG. 3A taken along the AA' direction.
Figure 3C:
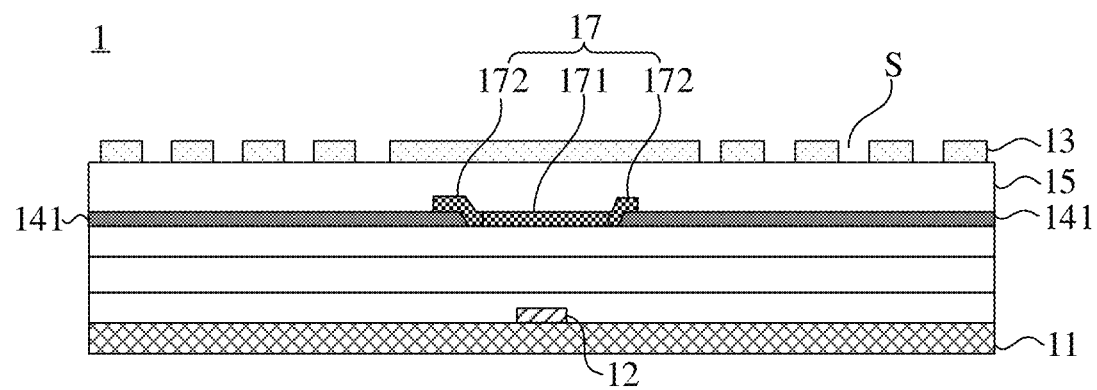
FIG. 3C is a sectional view of the partial structure in FIG. 3A taken along the BB' direction.

For example, as shown in FIGS. 3A to 3C, one gate line 12 is provided between two pixel sub-electrodes 141 of each pixel electrode 14 in each row of pixel electrodes 14. That is, a liquid crystal display panel adopting the array substrate 1 with this structure is of a single-gate structure.

Figure 2A:
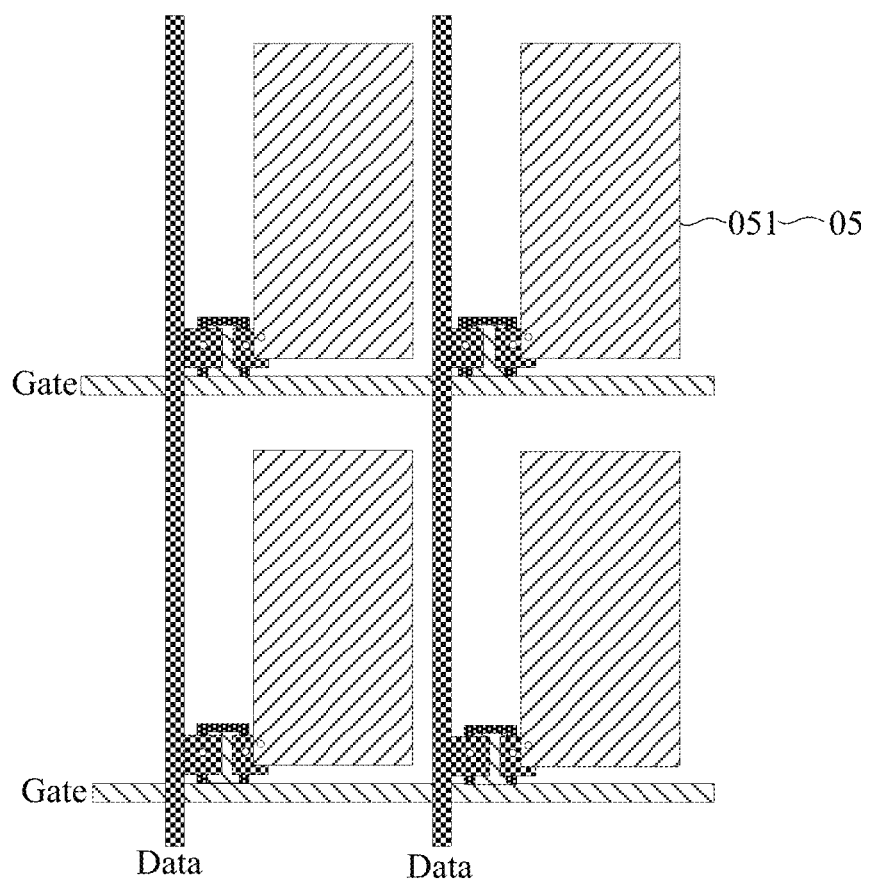
FIG. 2A is a top view of a partial structure of a liquid crystal display panel in the related art.
Figure 10A:
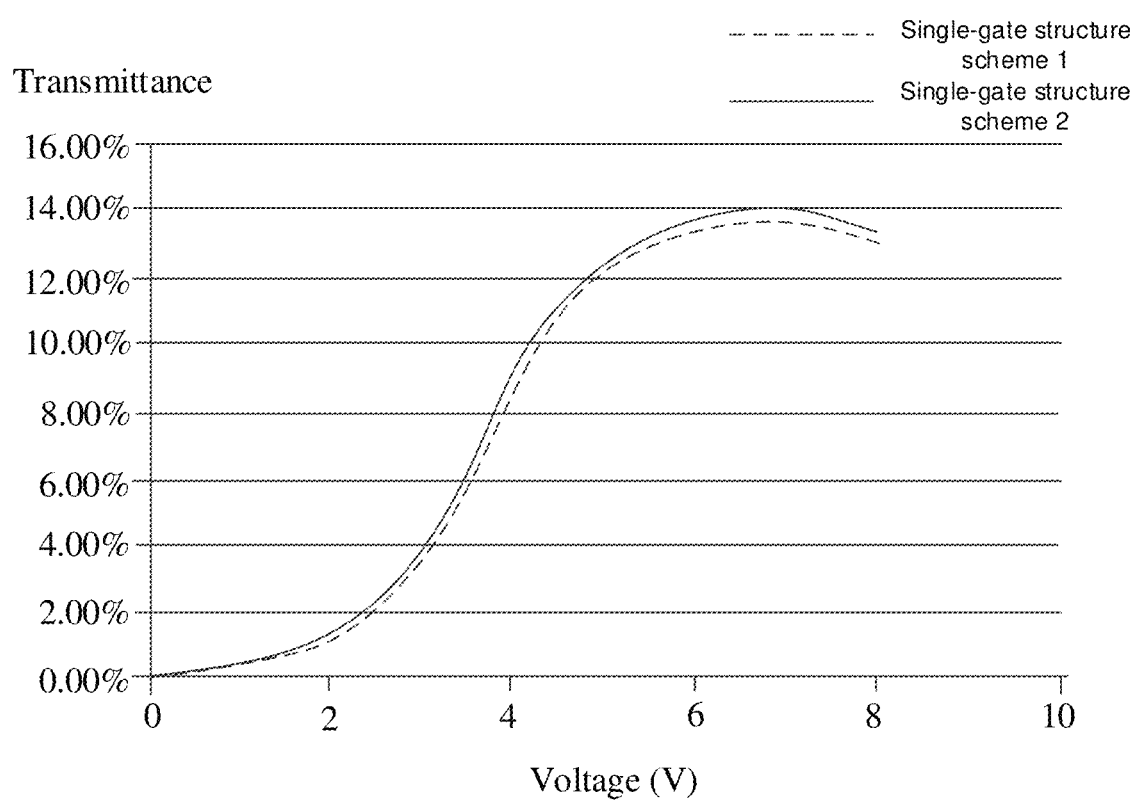
FIG. 10A is a graph illustrating comparison of transmittances of two liquid crystal display panels with different pixel electrode structures, in accordance with some embodiments of the present disclosure.

For example, FIG. 2A shows an arrangement structure of pixel electrodes 051 with a single-gate structure in the related art. FIG. 3A shows an arrangement structure of pixel electrodes 14 with a single-gate structure in some embodiments of the present disclosure. In a case where the arrangement structures of the pixel electrodes with the two single-gate structures are applied to liquid crystal display panels, when different voltages are applied to the pixel electrodes, a graph illustrating transmittances of the liquid crystal display panels adopting different arrangement structures of pixel electrodes is as shown in FIG. 10A. The single-gate structure scheme one represents a curve of a transmittance of a liquid crystal display panel adopting the arrangement structure of the pixel electrodes in the related art; and the single-gate structure scheme two represents a curve of a transmittance of a liquid crystal display panel adopting the arrangement structure of the pixel electrodes in some embodiments of the present disclosure.

In a case where a voltage of 5 V is applied to the pixel electrodes, the transmittance of the liquid crystal display panel adopting the arrangement structure of the pixel electrodes in the related art is 12.14%, and the transmittance of the liquid crystal display panel adopting the arrangement structure of the pixel electrodes in some embodiments of the present disclosure is 12.23%. That is, the transmittance of the liquid crystal display panel is improved by 0.77%.

In a case where the voltage applied to the pixel electrodes is a saturation voltage of the pixel electrodes, the transmittance of the liquid crystal display panel adopting the arrangement structure of the pixel electrodes in the related art is 13.68%, and the transmittance of the liquid crystal display panel adopting the arrangement structure of the pixel electrodes in some embodiments of the present disclosure is 13.90%. That is, the transmittance of the liquid crystal display panel is improved by 1.58%. Therefore, the liquid crystal display panel adopting the arrangement structure of the pixel electrodes in some embodiments of this disclosure can improve the transmittance.

For example, as shown in FIGS. 4A to 4E, two gate lines 12 are provided between the two pixel sub-electrodes 141 of each pixel electrode 14 in each row of pixel electrodes 14. That is, each row of pixel electrodes 14 corresponds to two gate lines 12. The two gate lines 12 are a first gate line 121 and a second gate line 122. Each row of pixel electrodes 14 includes first pixel electrodes 142 and second pixel electrodes 143 that are alternately arranged. Two pixel sub-electrodes 141 included in the first pixel electrode 142 are coupled to the first gate line 121, and two pixel sub-electrodes 141 included in the second pixel electrode 143 are coupled to the second gate line 122.

Of course, it may also be that the two pixel sub-electrodes 141 included in the first pixel electrode 142 are coupled to the second gate line 122, and the two pixel sub-electrodes 141 included in the second pixel electrode 143 are coupled to the first gate line 121, which is not limited in the present disclosure.

Figure 2B:
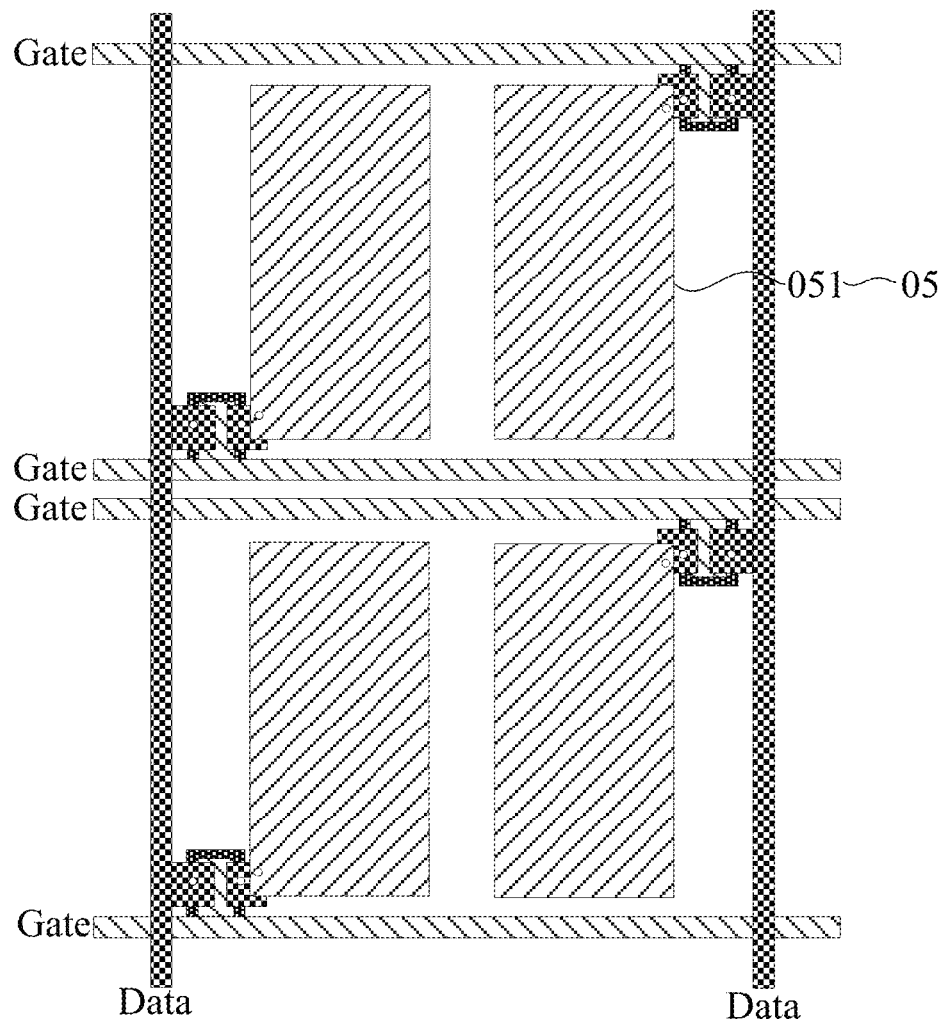
FIG. 2B is a top view of a partial structure of another liquid crystal display panel in the related art.
Figure 10B:
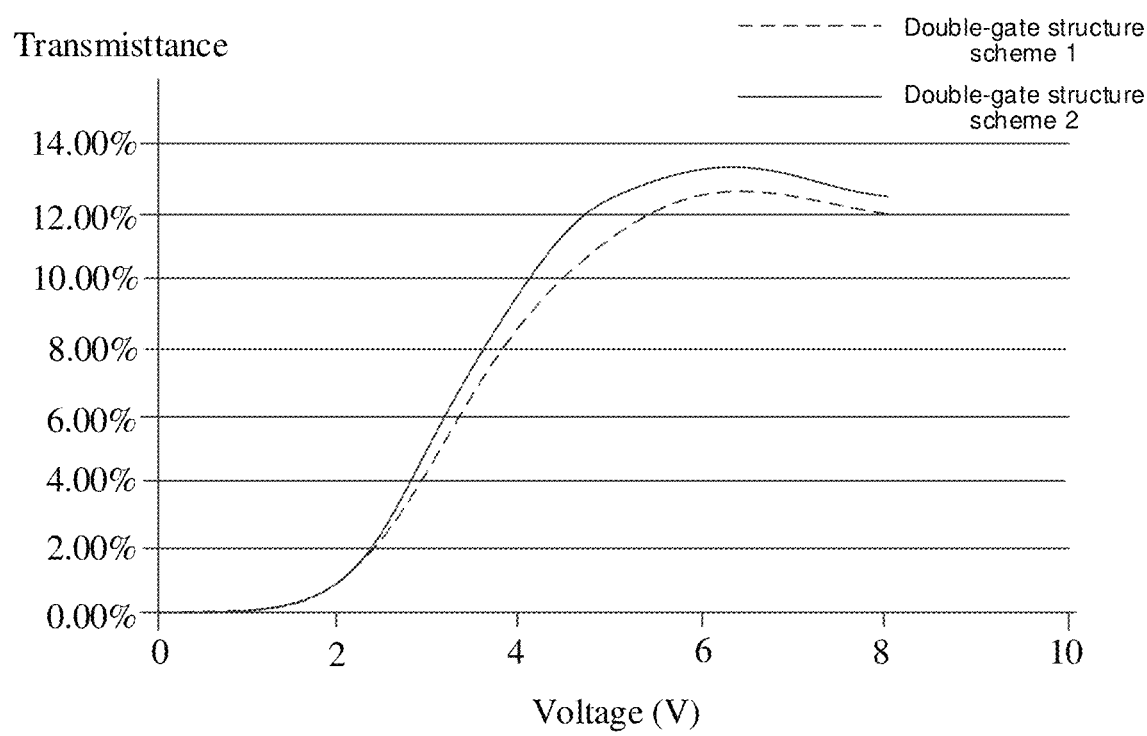
FIG. 10B is another graph illustrating comparison of transmittances of two liquid crystal display panels with different pixel electrode structures, in accordance with some embodiments of the present disclosure.

For example, FIG. 2B shows an arrangement structure of pixel electrodes 051 with a double-gate structure in the related art. FIG. 4A shows an arrangement structure of pixel electrodes 14 with a double-gate structure in some embodiments of the present disclosure. In a case where the arrangement structures of the pixel electrodes with the two double-gate structures are applied to the liquid crystal display panels, when different voltages are applied to the pixel electrodes, a graph illustrating transmittances of liquid crystal display panels adopting different arrangement structures of pixel electrodes is as shown in FIG. 10B. The double-gate structure scheme one represents a curve of a transmittance of a liquid crystal display panel adopting the arrangement structure of the pixel electrodes in the related art; and the double-gate structure scheme two represents a curve of a transmittance of a liquid crystal display panel adopting the arrangement structure of the pixel electrodes in some embodiments of the present disclosure.

In a case where the voltage of 5 V is applied to the pixel electrodes, the transmittance of the liquid crystal display panel adopting the arrangement structure of the pixel electrodes in the related art is 11.18%, and the transmittance of the liquid crystal display panel adopting the arrangement structure of the pixel electrodes in some embodiments of the present disclosure is 12.21%. That is, the transmittance of the liquid crystal display panel is improved by 9.21%.

In a case where the voltage applied to the pixel electrodes is a saturation voltage of the pixel electrodes, the transmittance of the liquid crystal display panel adopting the arrangement structure of the pixel electrodes in the related art is 12.29%, and the transmittance of the liquid crystal display panel adopting the arrangement structure of the pixel electrodes in some embodiments of the present disclosure is 13.05%. That is, the transmittance of the liquid crystal display panel is improved by 6.13%. Therefore, the liquid crystal display panel adopting the arrangement structure of the pixel electrodes in some embodiments of this disclosure can effectively improve the transmittance.

Figure 4B:
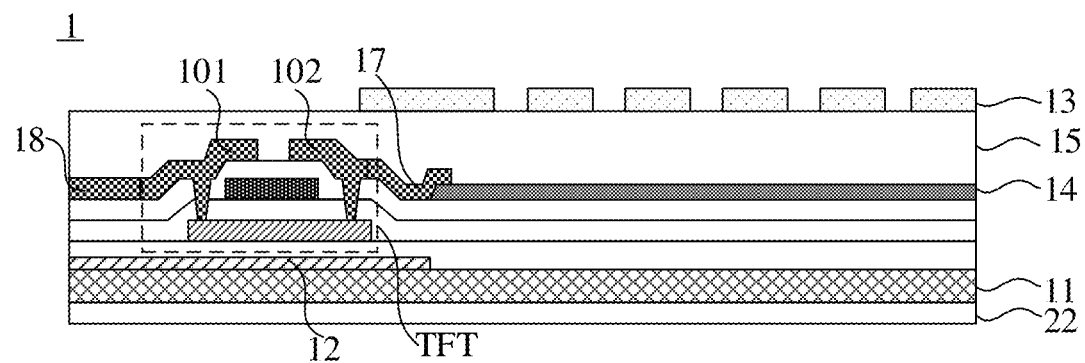
FIG. 4B is a sectional view of the partial structure in FIG. 4A taken along the CC' direction.
Figure 4C:
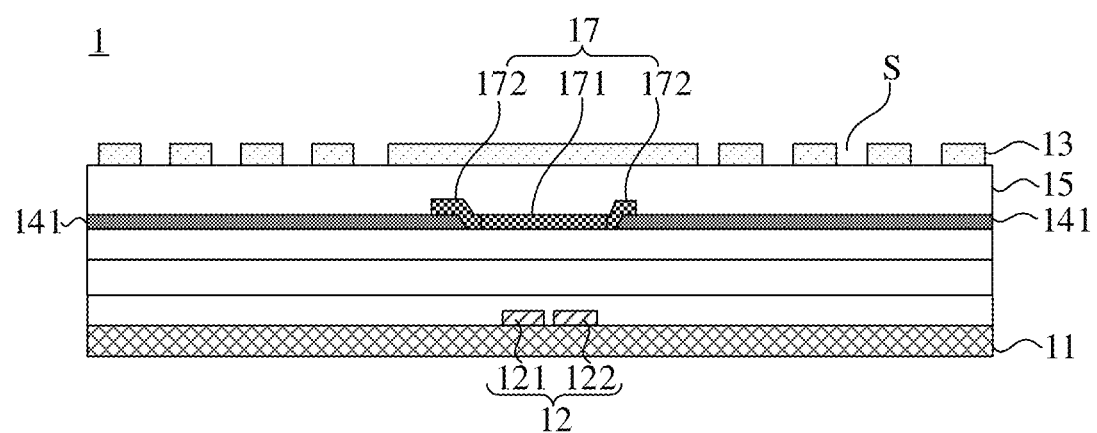
FIG. 4C is a sectional view of the partial structure in FIG. 4A taken along the DD' direction.
Figure 4D:
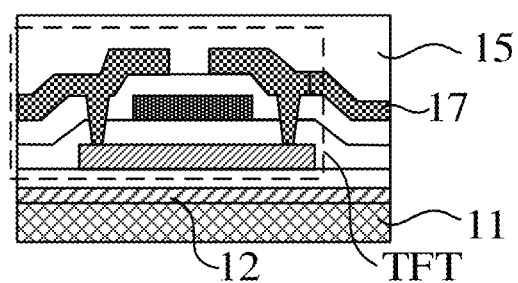
FIG. 4D is a sectional view of the partial structure in FIG. 4A taken along the EE' direction.
Figure 4E:
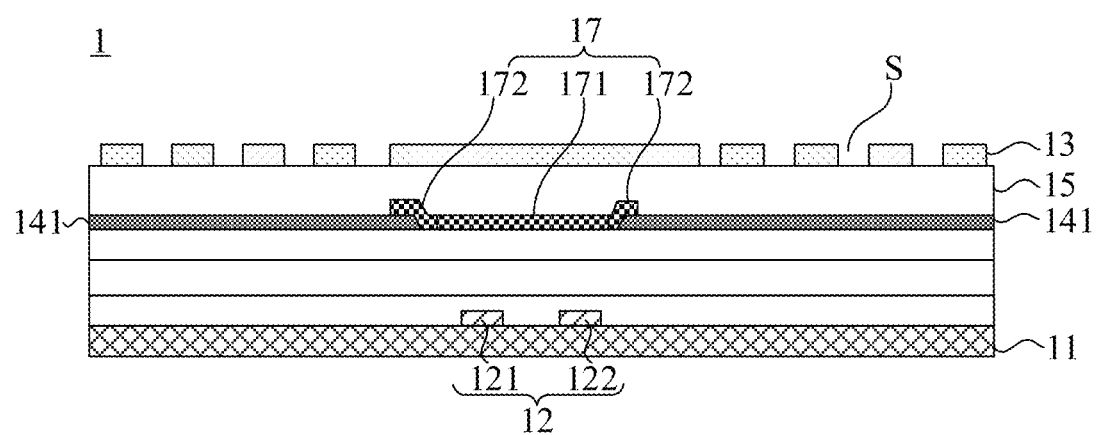
FIG. 4E is a sectional view of the partial structure in FIG. 4A taken along the FF' direction.

In some embodiments, as shown in FIGS. 3B and 4B, an insulating layer 15 is provided between the plurality of common electrodes 13 and the plurality of pixel electrodes 14 to prevent a short circuit between the plurality of common electrodes 13 and the plurality of pixel electrodes 14. The insulating layer 15 may be an insulating film layer, or may also be formed by stacking a plurality of insulating film layers, which is not limited in the present disclosure.

It will be noted that, two pixel sub-electrodes 141 included in a pixel electrode 14 belong to the same pixel electrode 14. That is, in the driving period of one frame, the polarities and magnitudes of the pixel voltages of the two pixel sub-electrodes 141 are the same.

In some embodiments, as shown in FIGS. 3A to 3C, 4A to 4E, 5A to 5B, 6A to 6C, and 7A to 7C, the array substrate 1 further includes a plurality of connection electrodes 17. The plurality of connection electrodes 17 are arranged in the first direction X.

For at least one pixel electrode 14 in each row of pixel electrodes 14, two pixel sub-electrodes 141 are electrically connected to each other through a connection electrode 17 of the plurality of connection electrodes 17. The connection electrode 17 is coupled to a gate line 12 located between the two pixel sub-electrodes 141. Here, the coupling of the connection electrode 17 and the gate line 12 located between the two pixel sub-electrodes 141 described herein means that the connection electrode 17 is coupled to the gate line 12 located between the two pixel sub-electrodes 141 through a thin film transistor TFT corresponding to the two pixel sub-electrodes 141, so that the two pixel sub-electrodes 141 is coupled to the gate line 12.

In this way, in the driving period of one frame, the magnitudes of the pixel voltages applied to the two pixel sub-electrodes 141 are the same, and the polarities of the pixel voltages provided to the two pixel sub-electrodes 141 are the same.

In some embodiments, for the arrangement structure of the pixel electrodes 14 with the single-gate structure shown in FIGS. 3A to 3C, shapes of the plurality of connection electrodes 17 are the same. For example, they are all in a shape shown in FIG. 9A, and the connection electrode 17 is in an "I" shape. For the arrangement structure of the pixel electrodes 14 with the double-gate structure shown in FIGS. 4A to 4E, the shapes of the plurality of connection electrodes 17 include two types. Each row of pixel electrodes 14 includes first pixel electrodes 142 and second pixel electrodes 143 that are alternately arranged. Shapes of connection electrodes 17 corresponding to the first pixel electrodes 142 are all the same. For example, they are all in a shape shown in FIG. 9A, i.e., an "I" shape. Shapes of connection electrodes corresponding to the second pixel electrodes 143 are all the same. For example, they are all in a shape shown in FIG. 9B, i.e., a "U" shape rotated 90° counterclockwise.

Figure 9A:
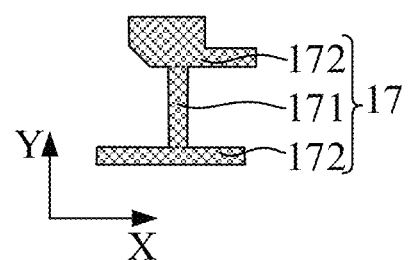
FIG. 9A is a top view of a structure of a connection electrode, in accordance with some embodiments of the present disclosure.
Figure 9B:
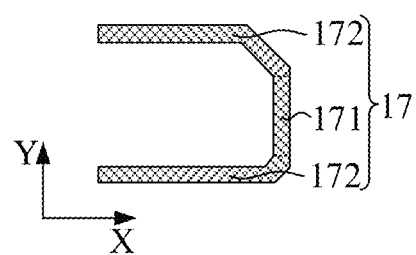
FIG. 9B is a top view of a structure of another connection electrode, in accordance with some embodiments of the present disclosure.

For example, as shown in FIGS. 9A and 9B, at least one connection electrode 17 of the plurality of connection electrodes 17 includes a first connection portion 171 and two second connection portions 172. The two second connection portions 172 are coupled to two ends of the first connection portion 171, respectively. The first connection portion 171 extends from one of two pixel sub-electrodes 141 electrically connected by the connection electrode 17 toward another. The two second connection portions 172 are coupled to the two pixel sub-electrodes 141 electrically connected to the connection electrode 17, respectively.

Since a direction pointing from one pixel sub-electrode 141 in a pixel electrode 14 to another pixel sub-electrode 141 in the same pixel electrode 14 intersects an extending direction of a gate line 12 corresponding to the pixel electrode 14, and the first connection portion 171 extends from one of the two pixel sub-electrodes 141 electrically connected by the connection electrode 17 toward another, there is a small overlapping area between an orthographic projection of the first connection portion 171 on the first base substrate 11 and an orthographic projection of the gate line 12 on the first base substrate 11. The gate line 12 corresponding to the first connection portion 171 is a gate line 12 between two pixel sub-electrodes 141 connected to the connection electrode 17 in which the first connection portion 171 is located. In this way, a coupling capacitance formed between the first connection portion 171 and its corresponding gate line 12 is reduced. That is, a coupling capacitance between the pixel electrode 14 corresponding to the first connection portion 171 and the corresponding gate line 12 is reduced, and a probability of crosstalk between the pixel electrode 14 corresponding to the first connection portion 171 and the corresponding gate line 12 is reduced.

For example, as shown in FIGS. 9A and 9B, the first connection portion 171 extends or substantially extends in the second direction Y. As a result, the overlapping area between the orthographic projection of the first connection portion 171 on the first base substrate 11 and the orthographic projection of the corresponding gate line 12 on the first base substrate 11 may be as small as possible. In this way, the coupling capacitance formed between the first connection portion 171 and its corresponding gate line 12 is further reduced. That is, the coupling capacitance between the pixel electrode 14 corresponding to the first connection portion 171 and the corresponding gate line 12 is further reduced, thereby further reducing the probability of the crosstalk between the pixel electrode 14 corresponding to the first connection portion 171 and the corresponding gate line 12.

In some examples, the connection electrode 17 may be of an integrated structure. That is, the first connection portion 171 extending or substantially extending in the second direction Y and the two second connection portions 172 extending or substantially extending in the first direction X form an integrated structure. In this case, it is beneficial to simplify the manufacturing process of the connection electrodes.

Here, a material of the connection electrode 17 may include a transparent conductive material, such as indium tin oxide (ITO), indium zinc oxide (IZO), or indium gallium zinc oxide (IGZO); or may also include a non-transparent conductive material, such as copper or silver. The material of the connection electrode is not limited, as long as it can conduct electricity.

In some embodiments, the array substrate 1 further includes a source-drain electrode layer disposed at a side of the plurality of pixel electrodes 14 proximate to the first base substrate 11. The source-drain electrode layer includes sources 101 and drains 102 of a plurality of thin film transistors TFT, and the pixel electrode 14 is coupled to a drain of a thin film transistor of the plurality of thin film transistors. On this basis, in a case where the connection electrode 17 is made of the non-transparent conductive material, as shown in FIG. 4B, the plurality of connection electrodes 17 may be disposed in the source-drain electrode layer, and are made of a same material as the sources and the drains. The source-drain electrode layer is made of a non-transparent conductive material, such as metal. In addition, the source-drain electrode layer may further include a plurality of data lines 18 in addition to the sources and the drains of the plurality of thin film transistors. That is, the plurality of connection electrodes 17 are made of a same material as the plurality of sources and the plurality of data lines.

In this way, a material of the second connection portion 172 is the same as the material of the drain, which enables the second connection portion 172 itself to play a role of shielding light. As a result, a width of a black matrix strip arranged in the first direction X in the display panel is reduced, which prevents a black matrix strip with a large width from affecting an aperture ratio of the pixel, improves the aperture ratio of the pixel, and improves the light transmittance of the liquid crystal display panel.

Furthermore, since the plurality of connection electrodes 17 are located in the source-drain electrode layer and are made of the same material as the sources, the drains, and the data lines in the source-drain electrode layer, the plurality of connection electrodes 17 may be formed through a single patterning process with the sources, the drains, and the data lines in the source-drain electrode layer, thereby simplifying the production process. The single patterning process refers to using a same film forming process to form a film layer that is used for forming a specific pattern (for example, a pattern including the sources, the drains and the connection electrodes), and then using a same mask to form the specific pattern at one time through exposure and development or etching.

Figure 6A:
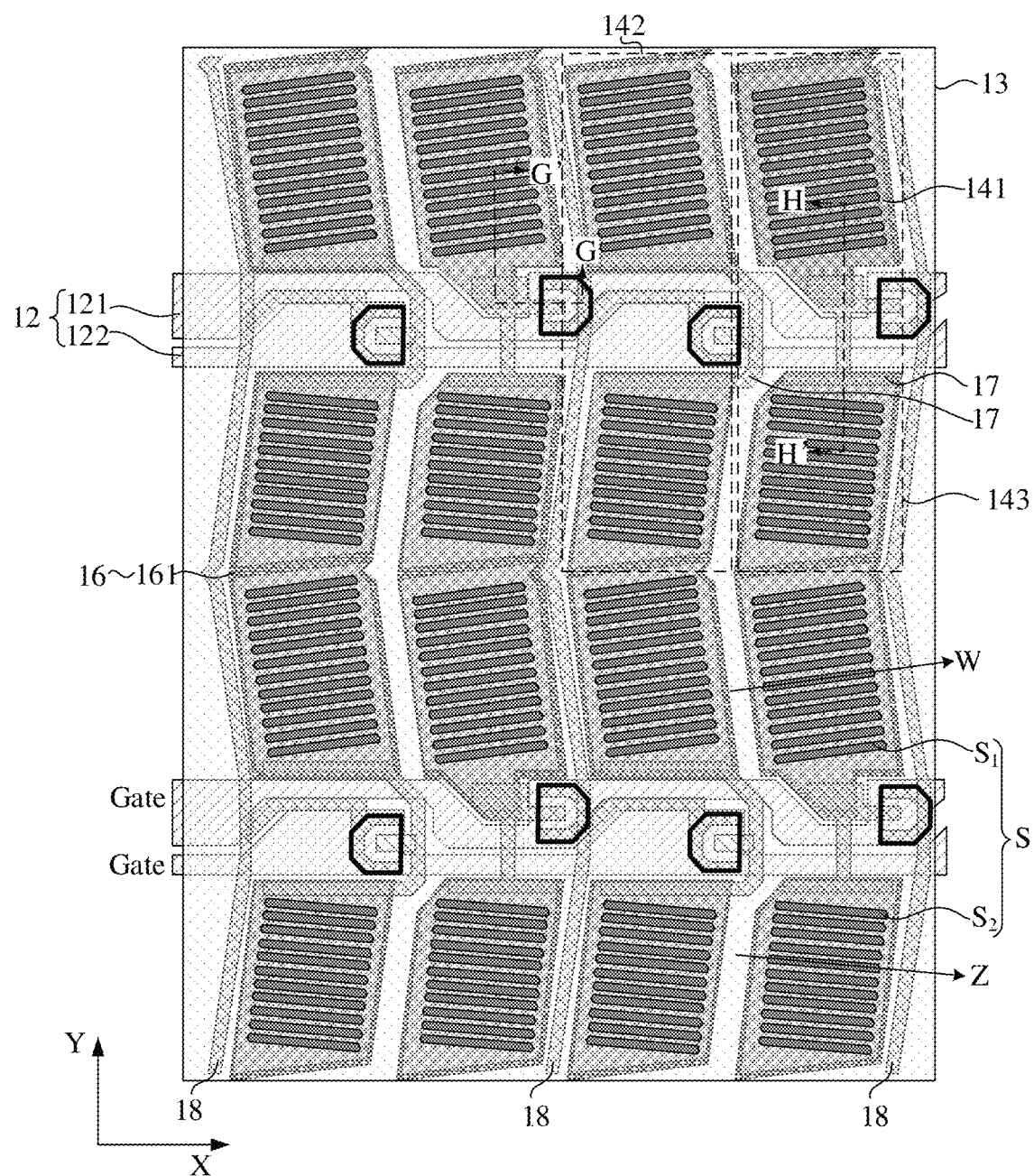
FIG. 6A is a top view of a partial structure of yet another pixel architecture, in accordance with some embodiments of the present disclosure.
Figure 6B:
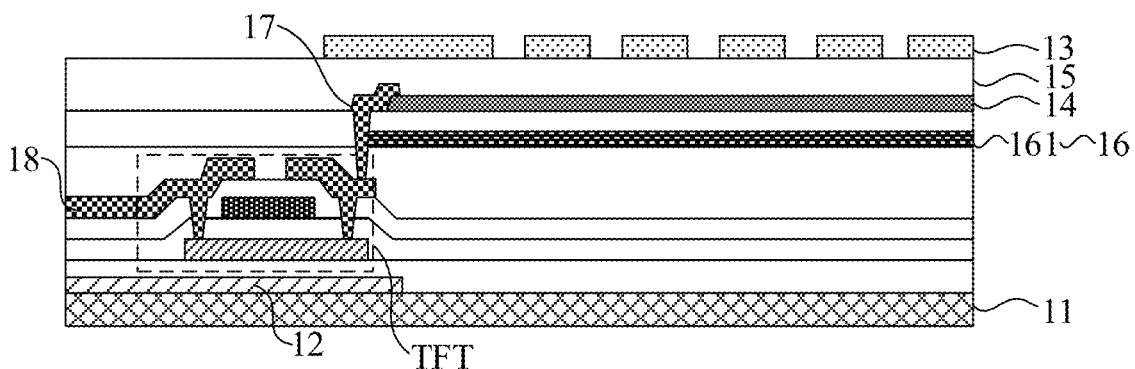
FIG. 6B is a sectional view of the partial structure in FIG. 6A taken along the GG' direction.

In some other embodiments, in a case where the connection electrode 17 is to made of a transparent conductive material, as shown in FIG. 6B, the plurality of connection electrodes 17 may be located in a same layer as the plurality of pixel electrodes 14, and the materials thereof are the same. The plurality of pixel electrodes 14 are made of a transparent conductive material, such as ITO. In this way, the plurality of connection electrodes 17 and the pixel electrodes 14 may be formed through a single patterning process, which simplifies the production process.

Figure 5A:
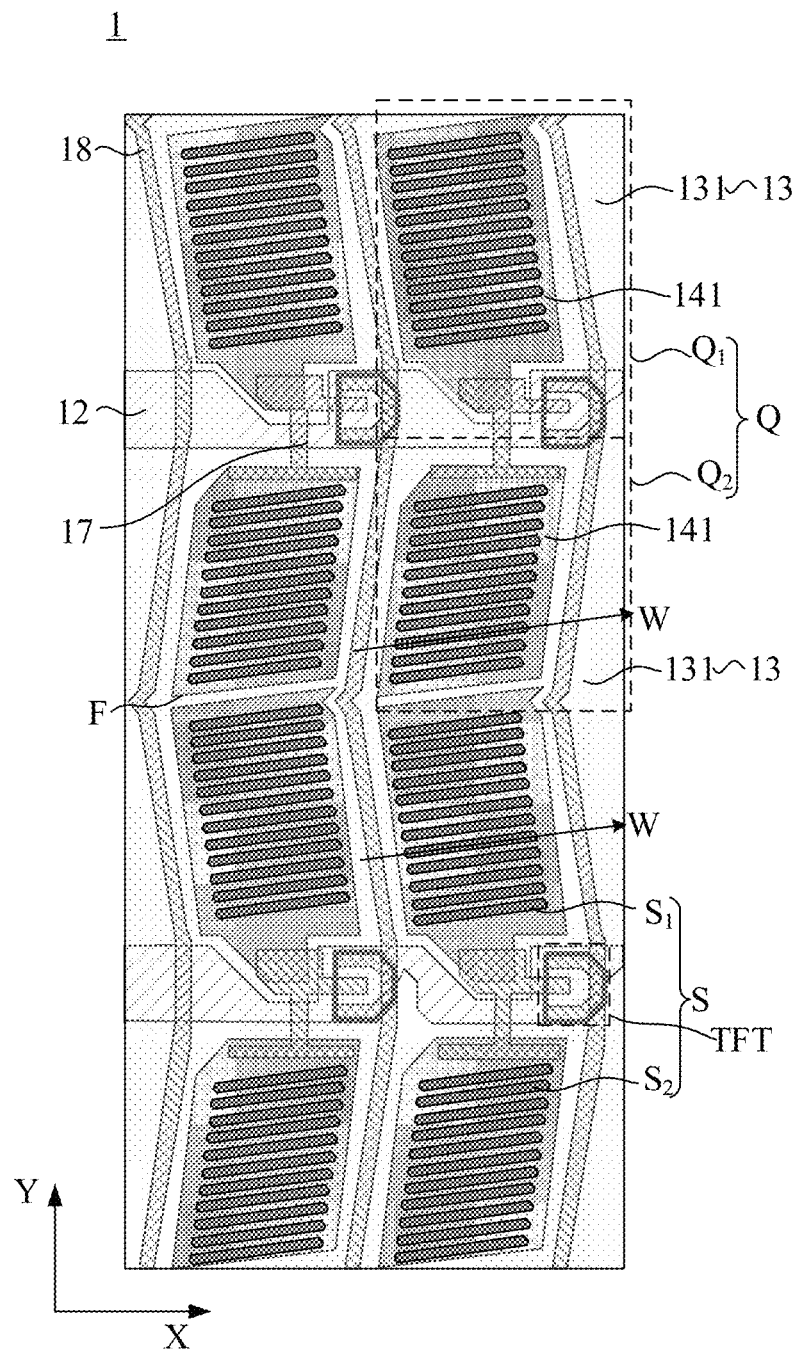
FIG. 5A is a top view of a partial structure of yet another pixel architecture, in accordance with some embodiments of the present disclosure.
Figure 5B:
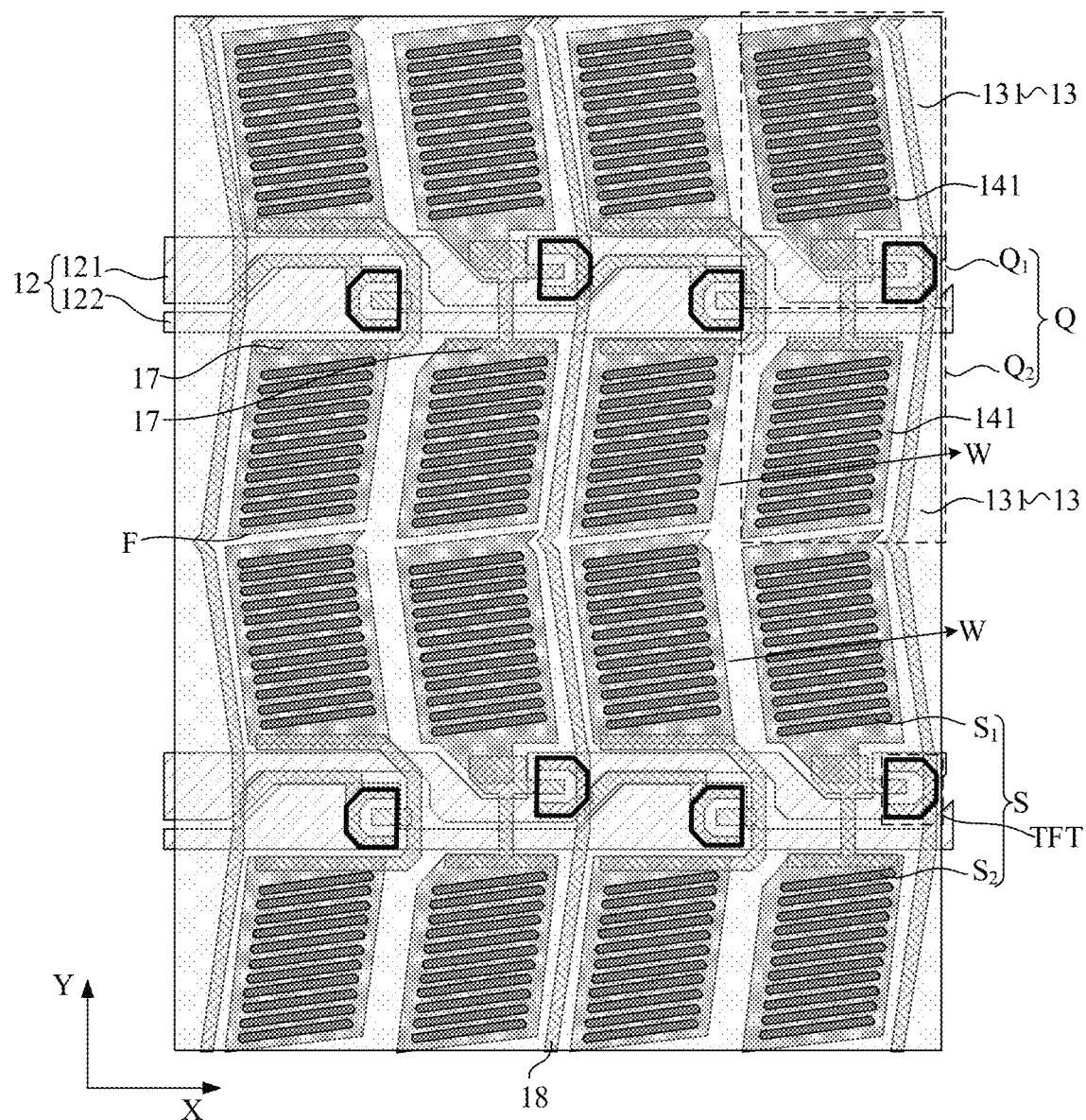
FIG. 5B is a top view of a partial structure of yet another pixel architecture, in accordance with some embodiments of the present disclosure.

In some embodiments, as shown in FIGS. 5A and 5B, the array substrate 1 has a plurality of sub-pixel regions Q. The plurality of common electrodes 13 are disposed in the plurality of sub-pixel regions Q, respectively, and the plurality of pixel electrodes 14 are disposed in the plurality of sub-pixel regions Q, respectively. That is, one common electrode 13 and one pixel electrode 14 correspond to one sub-pixel region Q. Here, in a case where the plurality of common electrodes 13 is an entire layer of common electrode, a portion of the common electrode located in a sub-pixel region Q is a common electrode 13.

Each sub-pixel region Q of the plurality of sub-pixel regions Q includes two sub-regions, e.g., a first sub-region $Q_1$ and a second sub-region $Q_2$. Two pixel sub-electrodes 141 of each pixel electrode 14 are disposed in a first sub-region $Q_1$ and a second sub-region $Q_2$, respectively. Each common electrode 13 includes two common sub-electrodes 131, and the two common sub-electrodes 131 are disposed in a first sub-region $Q_1$ and a second sub-region $Q_2$, respectively.

In some embodiments, as shown in FIGS. 3A, 4A, 5A, and 5B, at least one, farther away from the first base substrate 11, in a pixel sub-electrode 141 and a common sub-electrode 131 located in a same sub-region has multiple slits S, and directions of the multiple slits S are the same. For example, at least one, farther away from the first base substrate 11, in the pixel sub-electrode 141 and the common sub-electrode 131 located in the first sub-region $Q_1$ has multiple slits S, and directions of the multiple slits S are the same.

In a same sub-pixel region Q, directions of slits S of pixel sub-electrodes 141 or common sub-electrodes 131 located in different sub-regions may be the same (as shown in FIGS. 5A and 5B) or may be different (as shown in FIGS. 3A and 4A).

Here, with regard to the design of which one of the pixel sub-electrode 141 and the common sub-electrode 131 has slits S, reference may be made to the above description of the embodiments in which the plurality of common electrodes 13 and the plurality of pixel electrodes 14 have slits, which will not be repeated here.

For example, as shown in FIGS. 3A and 4A, in a same sub-pixel region Q, slit extending directions of sub-electrodes having slits S located in two sub-regions are different. In this way, in the display panel, the pixel electrode 14 may form an electric field with the common electrode 13 through the slits S in two directions, which neutralizes a cross-color, thereby effectively solving the problem of cross-color in the display panel.

Figure 8:
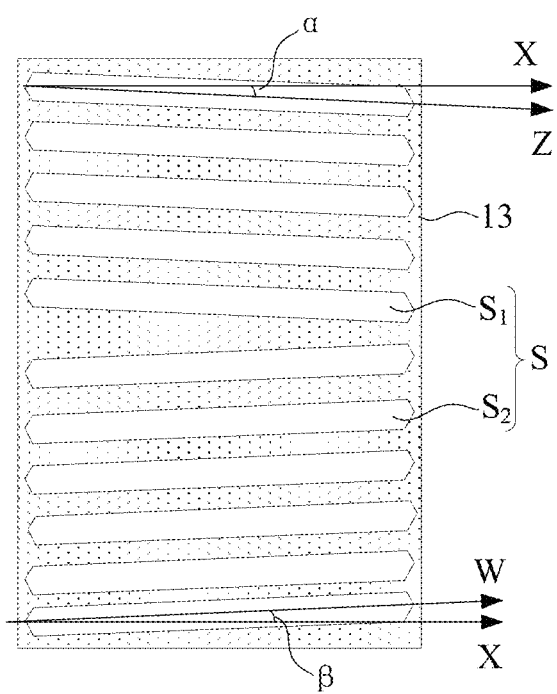
FIG. 8 is a top view of a partial structure of a common electrode, in accordance with some embodiments of the present disclosure.

For example, as shown in FIG. 8, in the same sub-pixel region Q, slit extending directions of sub-electrodes located in two sub-regions and each having slits are a third direction Z and a fourth direction W. An included angle α between the third direction Z and the first direction X is an acute angle. That is, the included angle α is greater than or equal to 0° and less than 90°. An included angle β between the fourth direction W and the first direction X is an acute angle. That is, the included angle β is greater than or equal to 0° and less than 90°. The third direction Z and the fourth direction W are symmetrical or substantially symmetrical about the first direction X.

For example, the included angle α between the third direction Z and the first direction X is in a range from 7° to 15°. The included angle α between the third direction Z and the first direction X is 11°. The included angle β between the fourth direction W and the first direction X is in a range from 7° to 15°. The included angle β between the fourth direction W and the first direction X is 11°

In this way, in the display panel, the pixel electrode 14 can form an electric field with the common electrode 13 through slits in two symmetrical or substantially symmetrical directions, which neutralizes the cross-color, thereby effectively solving the problem of cross-color in the display panel.

In some embodiments, as shown in FIGS. 5A and 5B, in each sub-region, an extending direction of an edge F of a pixel sub-electrode 141 away from a gate line 12 to which the pixel sub-electrode 141 is coupled is consistent with a slit direction of a sub-electrode located in the sub-region and having multiple slits S. Here, the sub-electrode having the slits S may be a pixel sub-electrode 141 or a common sub-electrode 131, or a collective name of the pixel sub-electrode 141 and the common sub-electrode 131.

In this way, since the extending direction of the edge F of the pixel sub-electrode 141 away from the gate line 12 to which the pixel sub-electrode 141 is coupled is consistent with the direction of the slits S, it is beneficial to make the pixel sub-electrode 141 form a strong electric field with the common sub-electrode 131 through the slits. As a result, it is beneficial to drive the liquid crystal molecules in a region where the electric field is located to deflect, so as to enhance the light extraction efficiency of the liquid crystal layer in this region, and further improve the transmittance of the liquid crystal display panel.

In some embodiments, as shown in FIGS. 5A and 5B, in the second direction Y, in two adjacent sub-regions belonging to two adjacent sub-pixel regions Q, slit extending directions of sub-electrodes having slits are the same. For example, slit extending directions of a sub-electrode having slits in a first sub-region $Q_1$ of a sub-pixel region Q are the same as slit extending directions of a sub-electrode having slits in a second sub-region $Q_2$ of an adjacent sub-pixel region Q in the second direction Y. For example, the slit extending directions are all the fourth direction W.

Figure 6C:
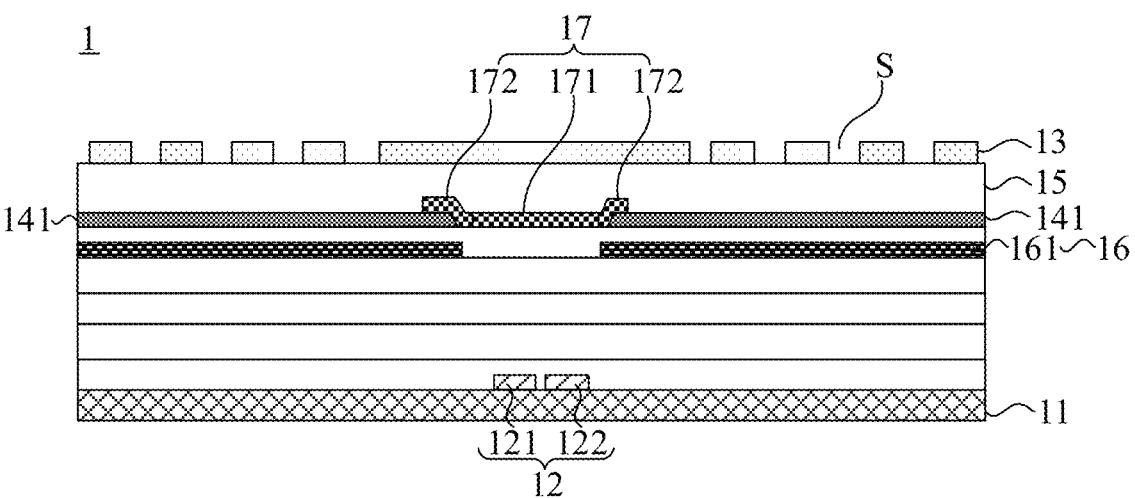
FIG. 6C is a sectional view of the partial structure in FIG. 6A taken along the HH' direction.

In some embodiments, as shown in FIGS. 6A to 6C, the array substrate 1 further includes a color filter layer 16. The color filter layer 16 includes a plurality of color filter portions 161 that are arranged in an array. Each column of color filter portions in the second direction Y allows light with a same color to pass through. An orthographic projection of each color filter portion 161 of the plurality of color filter portions 161 on the first base substrate 11 overlaps with or substantially overlaps with orthographic projections of two pixel sub-electrodes 141 that are adjacent in the column direction (i.e., the second direction Y) and belong to different pixel electrodes 14 on the first base substrate 11.

Here, the color filter layer 16 may be disposed between ones, closer to the first base substrate 11, of the plurality of pixel electrodes 14 and the plurality of common electrodes 13 and the first base substrate 11. In this way, it may prevent the color filter layer 16 from affecting an electric field formed between the plurality of pixel electrodes 14 and the plurality of common electrodes 13. For example, as shown in FIG. 6B, in a case where the plurality of pixel electrodes 14 are closer to the first base substrate 11 than the plurality of common electrodes 13, the color filter layer 16 may be disposed between the plurality of pixel electrodes 14 and the first base substrate 11.

It will be noted that, in a case where the array substrate 1 further includes a color filter layer 16, and the color filter layer 16 may be disposed between ones, closer to the first base substrate 11, of the plurality of pixel electrodes 14 and the plurality of common electrodes 13 and the first base substrate 11, as shown in FIGS. 6B and 6C, an insulating layer is provided between the sources and the drains (the source-drain electrode layer) of the thin film transistors TFT and the color filter layer 16, and another insulating layer is provided between the color filter layer 16 and the plurality of pixel electrodes 14. That is, in the array substrate 1 shown in FIGS. 6B and 6C, the plurality of connection electrodes 17 are coupled to the drains of the thin film transistors TFT through vias, so as to realize that the pixel electrodes 14 are coupled to the drains of the thin film transistors TFT.

On this basis, color filter portions 161 corresponding to two adjacent pixel electrodes 14 in the second direction Y have a same color. In this way, in the second direction Y, there is no need to provide a black matrix strip between the color filter portions corresponding to the two adjacent pixel electrodes 14 to separate the two color filter portions 161, thereby improving the transmittance of the liquid crystal display panel.

Figure 7A:
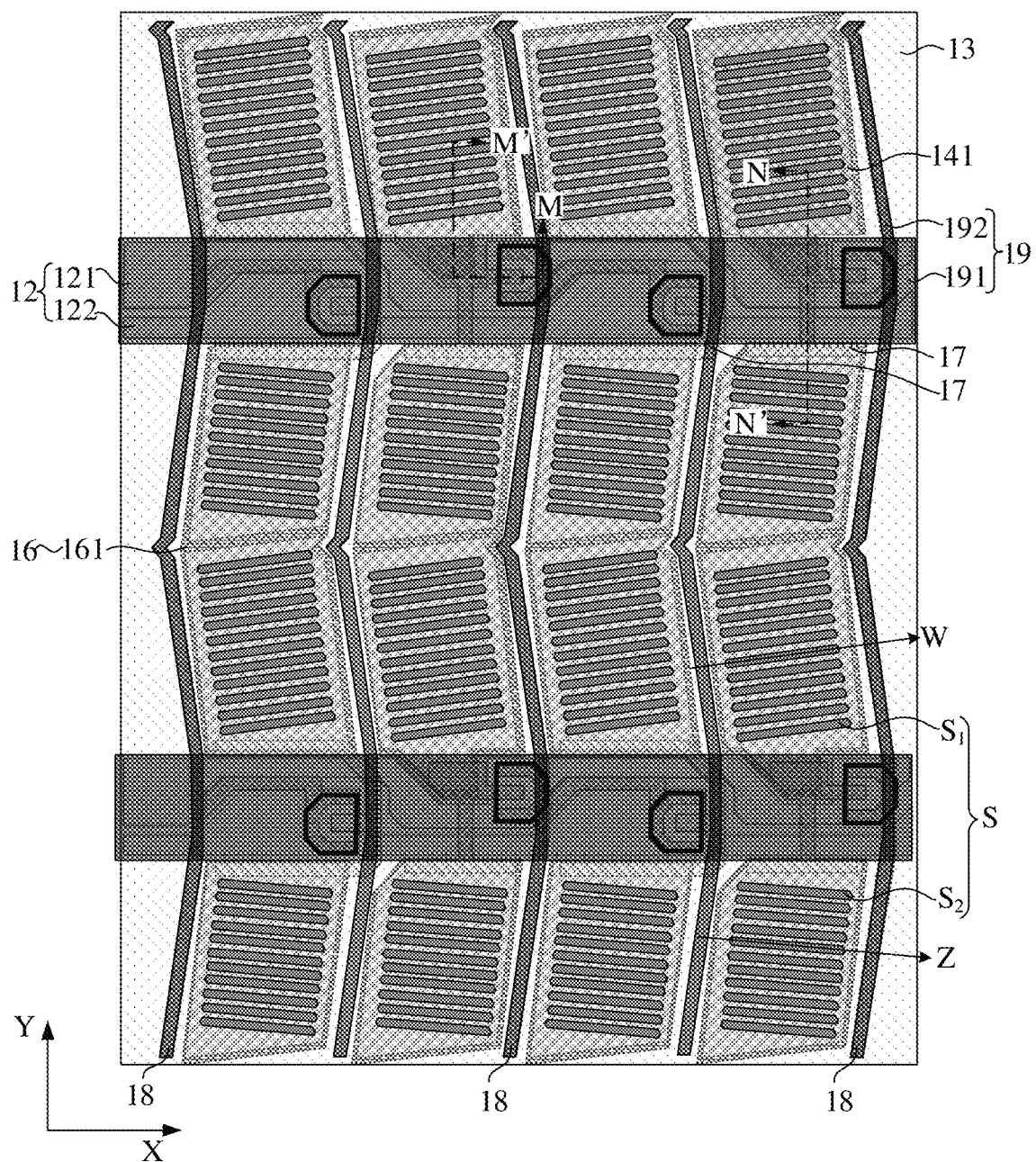
FIG. 7A is a top view of a partial structure of yet another pixel architecture, in accordance with some embodiments of the present disclosure.
Figure 7B:
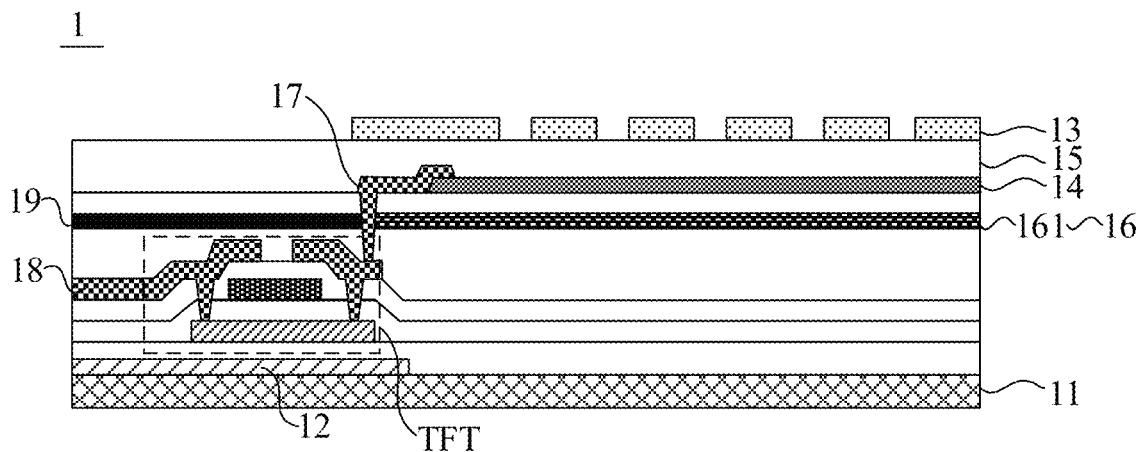
FIG. 7B is a sectional view of the partial structure in FIG. 7A taken along the MM' direction.
Figure 7C:
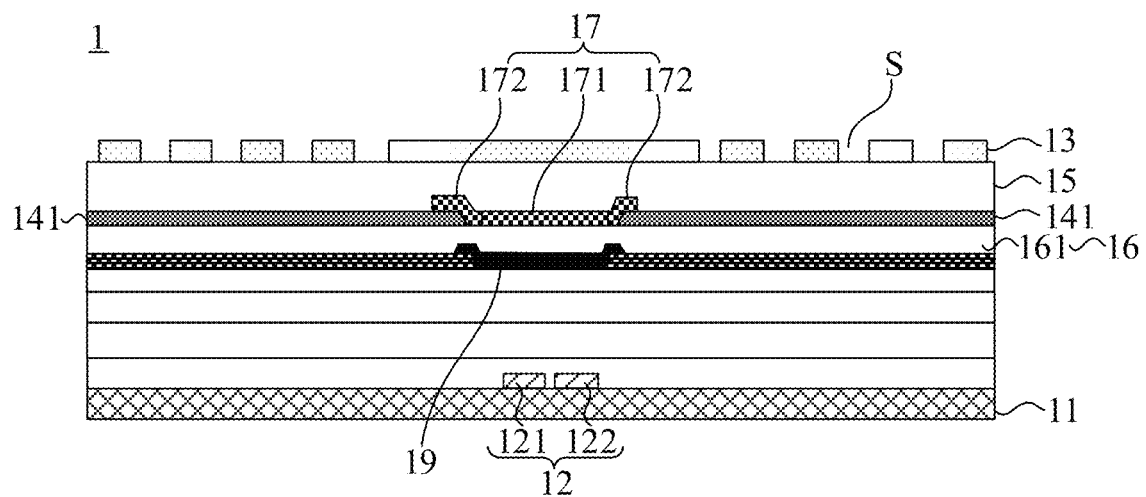
FIG. 7C is a sectional view of the partial structure in FIG. 7A taken along the NN' direction.

In some embodiments, as shown in FIGS. 7A to 7C, the array substrate further includes a black matrix 19. The black matrix 19 includes first black matrix strips 191 extending in the first direction X and second black matrix strips 192 extending in the second direction Y. The first black matrix strips 191 and the second black matrix strips 192 are disposed in gaps between the plurality of color filter portions 161. The first black matrix strip 191 extending in the first direction X is used for preventing the leakage of light, and the second black matrix strip 192 extending in the second direction Y is used for preventing cross-color between adjacent color filter portions in the second direction Y.

Figure 7D:
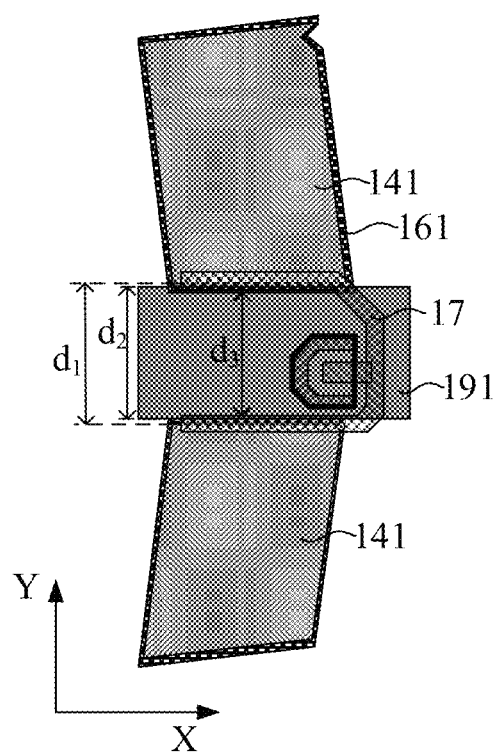
FIG. 7D is a top view of a region corresponding to a pixel electrode in FIG. 7A.

As shown in FIG. 7D, in a case where the array substrate 1 includes a plurality of connection electrodes 17, each connection electrode 17 includes a first connection portion 171 and two second connection portions 172, and the plurality of connection electrodes 17 are made of a light-shielding material (for example, the plurality of connection electrodes 17 are made of a same material as the drains, which is a metal material), a width $d_2$ of the first black matrix strip 191 is less than a width $d_1$ of a gap between two pixel sub-electrodes 141 that are adjacent in the column direction (such as the second direction Y) and belong to the same pixel electrode 14, and is greater than or equal to a width $d_3$ of a gap between two adjacent second connection portions 172 in the column direction (such as the second direction Y). The width $d_2$ of the first black matrix strip 191 refers to a dimension of the first black matrix strip 191 in the column direction (such as the second direction Y).

Since the plurality of connection electrodes 17 are made of the light-shielding material, the plurality of connection electrodes 17 can also play a role of shielding light, so that at the gap between the two pixel sub-electrodes 141 that are adjacent in the column direction (such as the second direction Y) and belong to the same pixel electrode 14, the connection electrode 17 and the first black matrix strip 191 shield light together. As a result, the width of the first black matrix strip 191 may be appropriately reduced, so that on a premise of ensuring that no leakage of light occurs, an influence of a black matrix strip with a large width on the aperture ratio of the pixel is avoided, the aperture ratio of the pixel is improved, and the light transmittance of the liquid crystal display panel is improved.

As a possible implementation, each first black matrix strip 191 has different widths in the first direction X. For example, taking a certain first black matrix strip 191 as an example, for a position in the first black matrix strip 191 corresponding to a connection electrode 17, in a case where the plurality of connection electrodes 17 are made of the light-shielding material, the width of the first black matrix strip 191 at this position is small. For example, the width may be less than the width $d_1$ of the gap between the two pixel sub-electrodes 141 that are adjacent in the column direction (e.g., the second direction Y) and belong to the same pixel electrode 14, and be greater than or equal to the width $d_3$ of the gap between the two adjacent second connection portions 172 in the column direction (e.g., the second direction Y), so as to improve the aperture ratio of the pixel. For the position in the first black matrix strip 191 corresponding to the connection electrode 17, the width of the first black matrix strip 191 at this position is relatively small, for example, may be less than the width $d_1$ of the gap between the two pixel sub-electrodes 141 that are adjacent in the column direction (e.g., the second direction Y) and belong to the same pixel electrode 14, so as to ensure the light shielding effect.

In some other examples, the width of the first black matrix strip 191 is greater than the width of the gap between the two pixel sub-electrodes 141 that are adjacent in the second direction Y and belong to the same pixel electrode 14, and the width of the first black matrix strip 191 is equal everywhere in the first direction X. In this way, it is possible to ensure that the first black matrix strip 191 fully plays a role of shielding light, thereby avoiding a poor display due to the leakage of light.

In some embodiments of the present disclosure, as shown in FIGS. 3A to 3C, and 4A to 4E, since there is no gate line provided between two pixel sub-electrodes 141 that are adjacent in a same column and belong to different pixel electrodes 14, a gap between the two pixel sub-electrodes 141 may be set to be relatively small. In this way, it is possible to form an effective superimposed electric field between the two pixel sub-electrodes 141 that are adjacent in the same column and belong to different pixel electrodes 14, which is beneficial to drive the liquid crystal molecules in a region where the superimposed electric field is located to deflect, so as to enhance the light extraction efficiency of the liquid crystal layer in this region, thereby improving the transmittance of the liquid crystal display panel. For example, a width of the gap between the two pixel sub-electrodes 141 that are adjacent in the same column and belong to different pixel electrodes 14 is in a range from 2.5 μm to 3.5 μm, such as 2.5 μm, 3 μm, or 3.5 μm.

Figure 11A:
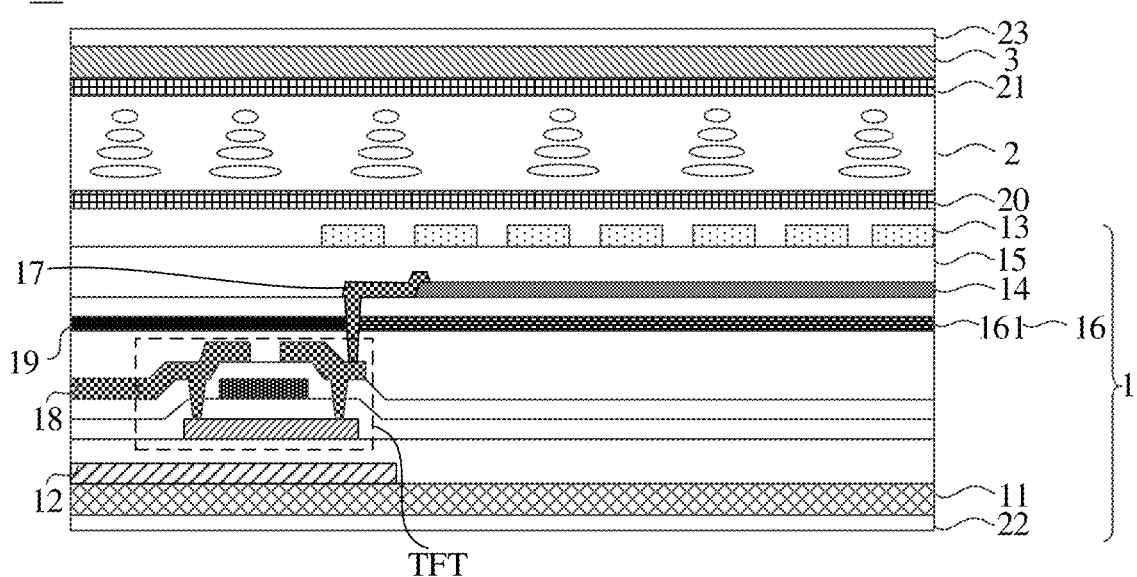
FIG. 11A is a sectional view of a partial structure of a display panel, in accordance with some embodiments of the present disclosure.
Figure 11B:
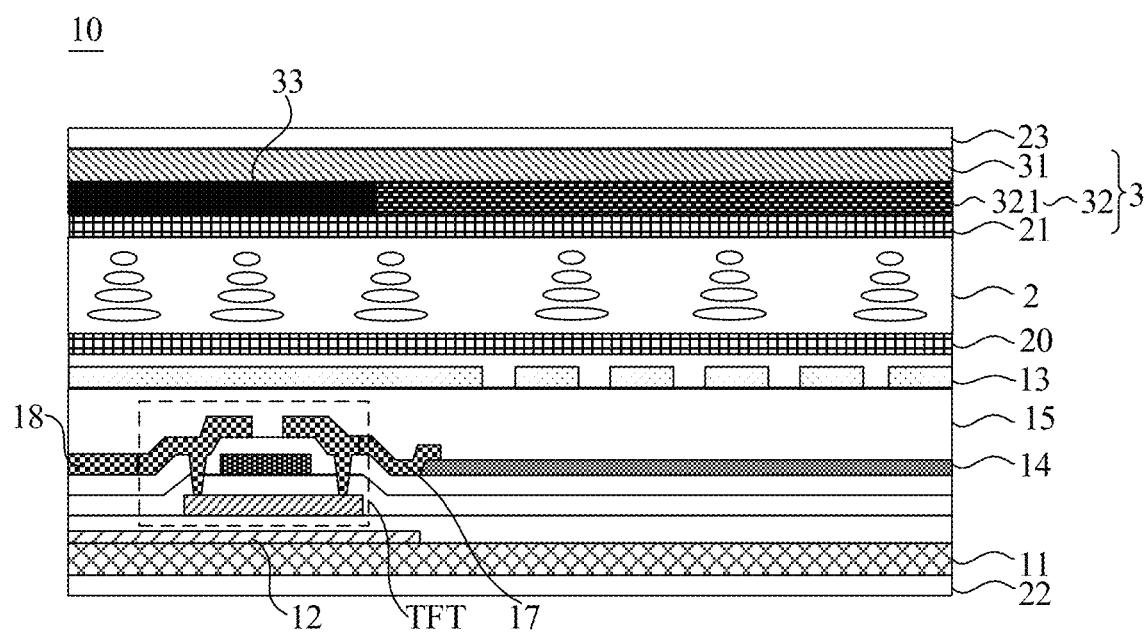
FIG. 11B is a sectional view of a partial structure of another display panel, in accordance with some embodiments of the present disclosure.

As shown in FIGS. 11A and 11B, some embodiments of the present disclosure provide a display panel 10. The display panel 10 includes: the array substrate 1 as described in any of the above embodiments, a counter substrate 3 disposed opposite to the array substrate 1, and a liquid crystal layer 2 disposed between the array substrate 1 and the counter substrate 3.

On this basis, in a case where the array substrate 1 is applied to a liquid crystal display panel of which a driving mode is line inversion or dot inversion, polarities of pixel voltages applied to two pixel sub-electrodes 141 corresponding to different rows of pixel electrodes 14, located between two adjacent rows of gate lines 12, and in a same column are opposite. In this way, since the polarities of the pixel voltages applied to the two pixel sub-electrodes 141 between two adjacent rows of gate lines 12 and in the same column are opposite, in addition to formation of lateral electric fields between each of the two adjacent pixel sub-electrodes 141 and the common electrode 13, a lateral superimposed electric field will also be formed between the two adjacent pixel sub-electrodes 141, which enhances the intensity of the electric field at a position in which the two adjacent pixel sub-electrodes 141 are adjacent. As a result, it is beneficial to drive the liquid crystal molecules in this region to deflect, so as to enhance the light extraction efficiency of the liquid crystal layer in this region, thereby increasing the transmittance of the liquid crystal display panel.

In addition, since the transmittance of the display panel 10 gets improved, in a case where a brightness of an image displayed by the display panel 10 is the same as a brightness of an image displayed by the liquid crystal display panel in the related art, the pixel voltage applied to the pixel electrode 14 of the display panel 10 may be smaller, thereby reducing power consumption of the display panel 10.

In some embodiments, as shown in FIGS. 7A and 11A, the array substrate 1 in the display panel 10 includes a color filter layer 16. The color filter layer 16 includes a plurality of color filter portions 161 arranged in an array. A black matrix strip is provided between two adjacent color filter portions 161. That is, the array substrate 1 adopts a color film on array (COA) technology. A structure of the array substrate 1 may be referred to the related description of the structure of the array substrate 1 shown in FIGS. 6A to 6C, and description will not be repeated here.

In some other embodiments, referring to FIG. 11B, the array substrate 1 in the display panel 10 does not include a color filter layer, and the counter substrate 3 includes a second base substrate 31 and a color filter layer 32 disposed on a side of the second base substrate 31 proximate to the array substrate 1. The color filter layer 32 includes a plurality of color filter portions 321 arranged in an array. In the second direction Y, each column of color filter portions 321 have a same color. An orthographic projection of each color filter portion of the plurality of color filter portions 321 on the array substrate 1 overlaps with or substantially overlaps with orthographic projections of two pixel sub-electrodes 141 that are adjacent in the column direction and belong to different pixel electrodes 14 on the first base substrate 11.

In this way, the colors of the color filter portions 321 corresponding to the two adjacent pixel electrodes 14 in the second direction Y are the same. As a result, there is no need to provide a black matrix strip between the color filter portions 321 corresponding to the two adjacent pixel electrodes 14 in the second direction Y to separate the two color filter portions 321, thereby ensuring the transmittance of the liquid crystal display panel.

Figure 12:
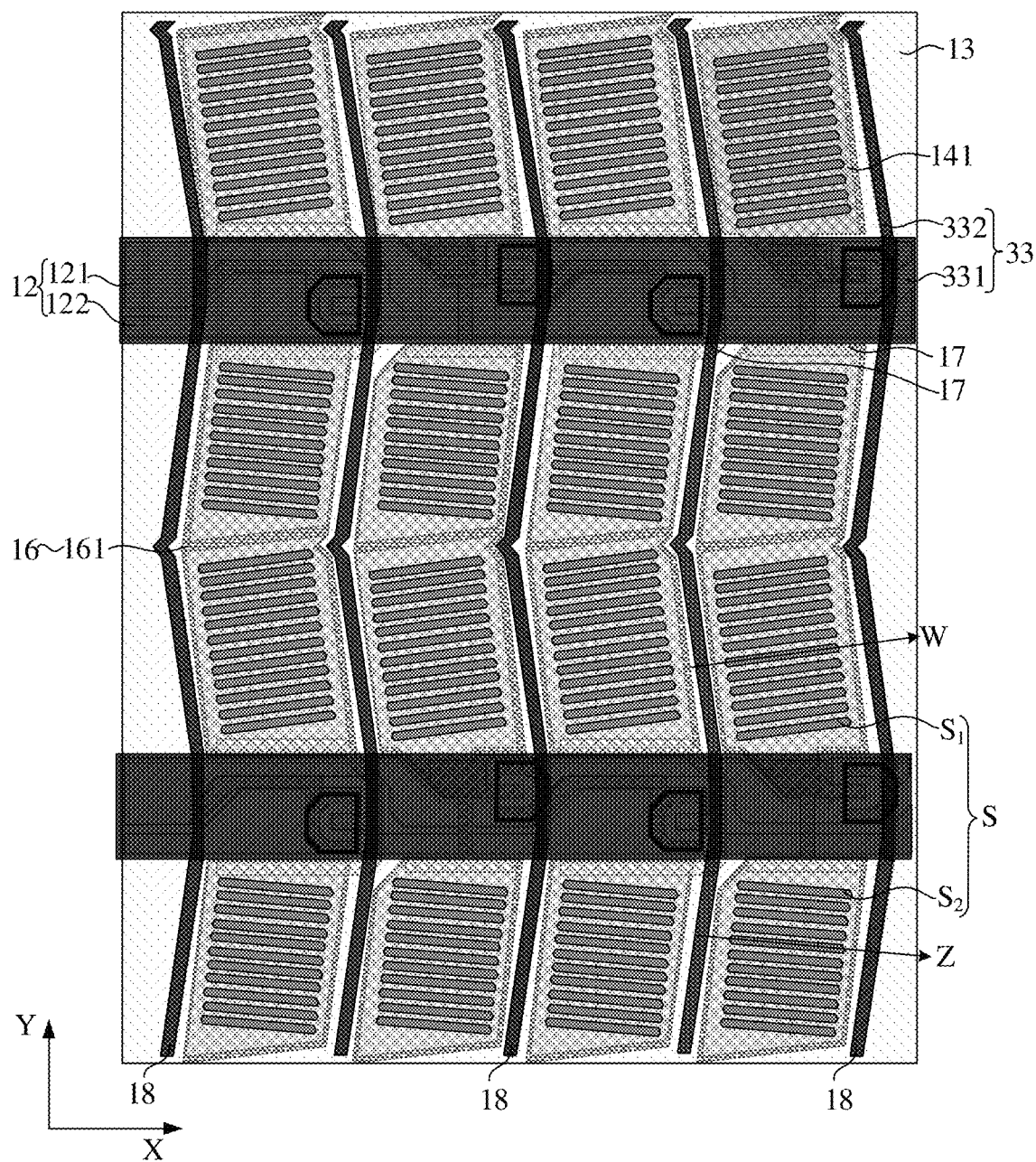
FIG. 12 is a top view of the display panel shown in FIG. 11B.

With continued reference to FIG. 11B, based on the display panel 10, the counter substrate 3 further includes a black matrix 33. As shown in FIG. 12, the black matrix 33 includes first black matrix strips 331 extending in the first direction X and second black matrix strips 332 extending in the second direction Y. The first black matrix strips 331 and the second black matrix strips 332 are disposed in the gaps between the plurality of color filter portions 321.

In some examples, in a case where the array substrate 1 includes a plurality of connection electrodes 17, each connection electrode 17 includes a first connection portion 171 and two second connection portions 172, and the plurality of connection electrodes 17 are made of a light-shielding material, a width of the first black matrix strip 331 is less than a width of a gap between two pixel sub-electrodes that are adjacent in the column direction and belong to a same pixel electrode, and is greater than or equal to a width of a gap between two adjacent second connection portions 172 in the column direction. In this way, it may effectively shield the gap between the two adjacent second connection portions 172 to avoid the leakage of light in the gap between the two adjacent second connection portions 172. Moreover, since the plurality of connection electrodes 17 can also play a role of shielding light, the width of the first black matrix strip 191 may be reduced, so that on a premise of ensuring that no leakage of light occurs, an influence of the black matrix strip with a large width on the aperture ratio of the pixel is avoided, the aperture ratio of the pixel is improved, and the light transmittance of the liquid crystal display panel is improved.

In some other examples, the width of the first black matrix strip 191 is greater than the width of the gap between the two pixel sub-electrodes 141 that are adjacent in the second direction Y and belong to the same pixel electrode 14, and the width of the first black matrix strip 191 is equal everywhere in the first direction X. In this way, it is possible to ensure that the first black matrix strip 191 fully plays a role of shielding light, thereby avoiding a poor display due to the leakage of light.

With reference to FIGS. 11A and 11B again, in some embodiments, the display panel 10 further includes: a first alignment layer 20 disposed on a side of the array substrate 1 proximate to the liquid crystal layer 2, a second alignment layer 21 disposed on a side of the counter substrate 3 proximate to the liquid crystal layer 2, a first polarizer 22 disposed on a side of the array substrate 1 away from the liquid crystal layer 2, and a second polarizer 23 disposed on a side of the counter substrate 3 sequential away from the liquid crystal layer 2.

For example, alignment directions of the first alignment layer 20 and the second alignment layer 21 are perpendicular to or substantially perpendicular to each other. Polarization directions of the first polarizer 22 and the second polarizer 23 are perpendicular to or substantially perpendicular to each other.

Figure 13:
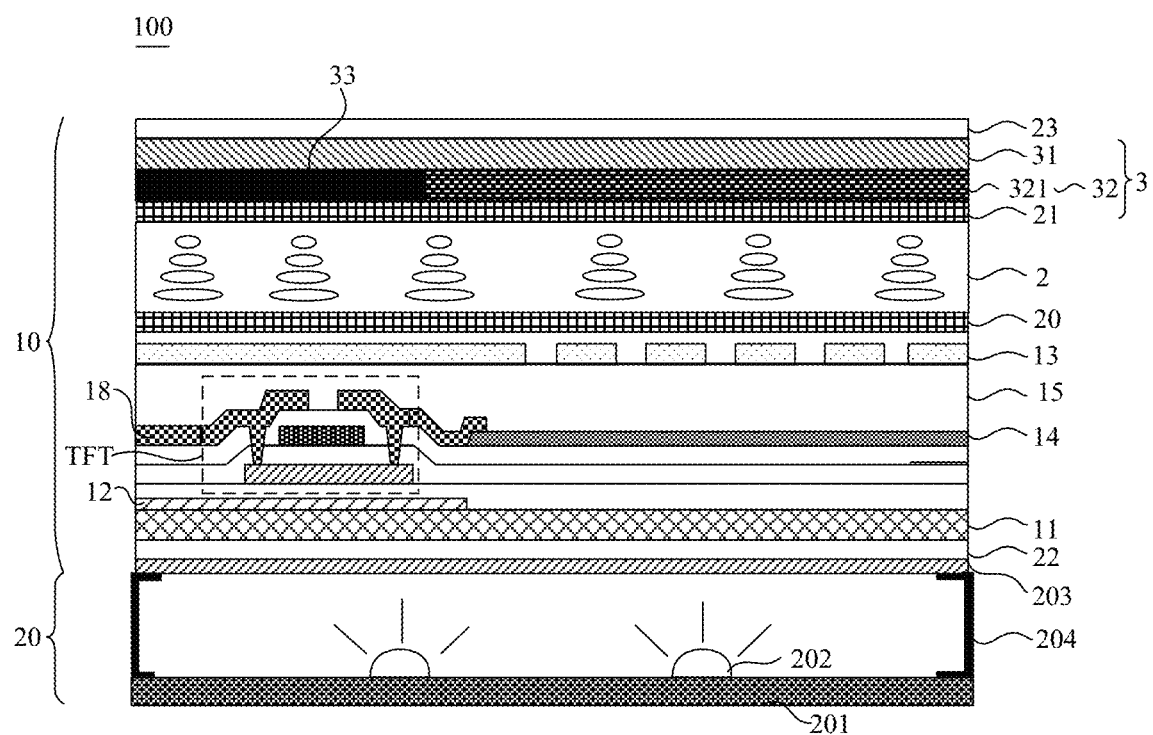
FIG. 13 is a sectional view of a partial structure of a display device, in accordance with some embodiments of the present disclosure.

As shown in FIG. 13, some embodiments of the present disclosure provide a display device 100. The display device 100 includes the display panel 10 as described in any of the above embodiments.

Beneficial effects of the display device 100 are the same as beneficial effects of the display panel, which will not be repeated here.

As shown in FIG. 13, the display device 100 further includes a backlight module 20 (a direct-lit backlight module is taken as an example in the figure) disposed on a side of the display panel 10 (e.g., a side of the array substrate 1). The backlight module 20 includes a back plate 201, light sources 202, a diffusion plate 203 and a frame 204, and the backlight module 20 is configured to provide the display panel 10 with light required for displaying images.

The display device 100 provided by the embodiments of the present disclosure may be any device that displays images whether in motion (e.g., a video) or stationary (e.g., a static image), and whether literal or graphical. More specifically, it is anticipated that the described embodiments may be implemented in or associated with a plurality of display devices, and the plurality of display devices may include, but are not limit to: mobile phones, wireless devices, portable android devices (PAD), hand-held or portable computers, global positioning system (GPS) receivers/navigators, cameras, MPEG-4 Part 14 (MP4) video players, video cameras, game consoles, flat panel displays, computer monitors, and car displays (such as a drive recorder or a backup camera of a car).

The foregoing descriptions are merely some specific implementation manners of the present disclosure, but the protection scope of the present disclosure is not limited thereto, and changes or replacements that any person skilled in the art could conceive of within the technical scope disclosed by the present disclosure should be within the protection scope of the present disclosure. Therefore, the protection scope of the present disclosure shall be subject to the protection scope of the claims.

What is claimed is:

1. An array substrate, comprising:
   a first base substrate;
   a plurality of gate lines extending in a first direction on the first base substrate;
   a plurality of common electrodes disposed at a side of the plurality of gate lines away from the first base substrate; and
   a plurality of pixel electrodes disposed at the side of the plurality of gate lines away from the first base substrate and arranged in an array; the plurality of pixel electrodes being arranged into a plurality of rows of pixel electrodes extending in the first direction, at least one pixel electrode in each row of pixel electrodes including two pixel sub-electrodes arranged in a second direction, one gate line being disposed between the two pixel sub-electrodes, and the two pixel sub-electrodes being coupled to a gate line in the one gate line, an orthogonal projection of the two pixel sub-electrodes on the first base substrate being not overlapped with an orthogonal projection of the one gate line on the first base substrate; and
   a plurality of connection electrodes arranged in the first direction, the two pixel sub-electrodes of the at least one pixel electrode in each row of pixel electrodes being electrically connected through a connection electrode in the plurality of connection electrodes, and the connection electrode overlapping with the gate line located between the two pixel sub-electrodes in a plan view;
   wherein each electrode in at least electrodes, farther away from the first base substrate, in the plurality of common electrodes and the plurality of pixel electrodes has a plurality of slits, and the first direction and the second direction intersect,
   wherein the connection electrode in the plurality of connection electrodes includes a first connection portion extending from one of the two pixel sub-electrodes electrically connected by the connection electrode toward another, and two second connection portions directly contact two ends of the first connection portion, respectively, and directly contact and cover edges of the two pixel sub-electrodes electrically connected to the connection electrode, respectively, and
   wherein the first connection portion extends in the second direction; and each of the two second connection portions extends in the first direction and is perpendicular to the first connection portion.

2. The array substrate according to claim 1, further comprising a source-drain electrode layer disposed at a side of the plurality of pixel electrodes proximate to the first base substrate, the source-drain electrode layer including sources and drains of a plurality of thin film transistors, wherein the plurality of connection electrodes is located in the source-drain electrode layer and is made of a same material as the sources and the drains; and each pixel electrode is coupled to a drain of a thin film transistor in the plurality of thin film transistors through a connection electrode of the plurality of connection electrodes.

3. The array substrate according to claim 1, wherein the plurality of connection electrodes and the plurality of pixel electrodes are located in a same layer and are made of a same material.

4. The array substrate according to claim 1, wherein the array substrate has a plurality of sub-pixel regions, and the plurality of common electrodes and the plurality of pixel electrodes are disposed in the plurality of sub-pixel regions;

each sub-pixel region of the plurality of sub-pixel regions includes two sub-regions, and two pixel sub-electrodes of each pixel electrode are disposed in two sub-regions of a sub-pixel region, respectively;

each common electrode includes two common sub-electrodes, and the two common sub-electrodes are disposed in two sub-regions of a sub-pixel region, respectively; and at least one, farther away from the first base substrate, of a pixel sub-electrode and a common sub-electrode that are located in a same sub-region has slits, and extending directions of the slits are the same.

5. The array substrate according to claim 4, wherein in each sub-region, an extending direction of an edge of a pixel sub-electrode away from a gate line to which the pixel sub-electrode is coupled is consistent with slit extending directions of a sub-electrode located in the sub-region and having slits.

6. The array substrate according to claim 4, wherein in a same sub-pixel region, slit extending directions of sub-electrodes located in two sub-regions and each having slits are different.

7. The array substrate according to claim 6, wherein in the same sub-pixel region, the slit extending directions of the sub-electrodes located in the two sub-regions and each having the slits are a third direction and a fourth direction;

an included angle between the third direction and the first direction, and an included angle between the fourth direction and the first direction are both greater than or equal to 0° and less than 90°; and the third direction and the fourth direction are symmetrical about the first direction.

8. The array substrate according to claim 4, wherein in two sub-regions that are adjacent in the second direction and belong to two adjacent sub-pixel regions, slit extending directions of sub-electrodes each having slits are the same.

9. The array substrate according to claim 1, wherein one gate line is disposed between two pixel sub-electrodes of each pixel electrode in each row of pixel electrodes.

10. The array substrate according to claim 1, wherein two gate lines are disposed between two pixel sub-electrodes of each pixel electrode in each row of pixel electrodes, and the two gate lines are a first gate line and a second gate line; and each row of pixel electrodes includes first pixel electrodes and second pixel electrodes that are arranged alternately, two pixel sub-electrodes included in a first pixel electrode are coupled to a first gate line, and two pixel sub-electrodes included in a second pixel electrode are coupled to a second gate line.

11. The array substrate according to claim 1, further comprising a color filter layer including a plurality of color filter portions arranged in an array; wherein along the second direction, each column of color filter portions allow light with a same color to pass through; and an orthographic projection of each color filter portion of the plurality of color filter portions on the first base substrate overlaps with orthographic projections of two pixel sub-electrodes that are adjacent in the second direction and belong to different pixel electrodes on the first base substrate.

12. The array substrate according to claim 11, further comprising a black matrix, the black matrix including first black matrix strips extending in the first direction and second black matrix strips extending in the second direction, and the first black matrix strips and the second black matrix strips being disposed in gaps between the plurality of color filter portions; wherein the array substrate comprises a plurality of connection electrodes, each connection electrode includes a first connection portion and two second connection portions, and the plurality of connection electrodes are made of a light-shielding material, a width of a first black matrix strip is less than a width of a gap between two pixel sub-electrodes that are adjacent in the second direction and belong to a same pixel electrode, and is greater than or equal to a width of a gap between two adjacent second connection portions in the second direction.

13. The array substrate according to claim 1, wherein a width of a gap between two pixel sub-electrodes that are adjacent in the second direction and belong to different pixel electrodes is in a range from 2.5 µm to 3.5 µm.

14. A display panel, comprising:

the array substrate according to claim 1;

a counter substrate disposed opposite to the array substrate; and a liquid crystal layer disposed between the array substrate and the counter substrate.

15. The display panel according to claim 14, wherein the counter substrate includes a second base substrate and a color filter layer disposed on a side of the second base substrate proximate to the array substrate;

the color filter layer includes a plurality of color filter portions arranged in an array, and along the second direction, each column of color filter portions has a same color; and an orthographic projection of each color filter portion of the plurality of color filter portions on the first base substrate of the array substrate overlaps with orthographic projections of two pixel sub-electrodes that are adjacent in the second direction and belong to different pixel electrodes on the first base substrate.

16. The display panel according to claim 15, wherein the counter substrate further includes a black matrix, the black matrix includes first black matrix strips extending in the first direction and second black matrix strips extending in the second direction, and the first black matrix strips and the second black matrix strips are disposed in gaps between the plurality of color filter portions; and the array substrate includes a plurality of connection electrodes, each connection electrode includes a first connection portion and two second connection portions, and the plurality of connection electrodes are made of a light-shielding material, a width of a first black matrix strip is less than a width of a gap between two pixel sub-electrodes that are adjacent in the second direction and belong to a same pixel electrode, and is greater than or equal to a width of a gap between two adjacent second connection portions in the second direction.

\* \* \* \* \*